(12) United States Patent
Brecht et al.

(10) Patent No.: US 8,834,664 B2
(45) Date of Patent: Sep. 16, 2014

(54) PHOTOVOLTAIC MODULES FOR USE IN VEHICLE ROOFS, AND/OR METHODS OF MAKING THE SAME

(75) Inventors: Greg Brecht, Grosse Point Farms, MI (US); Vincent E. Ruggero, II, Fort Wayne, IN (US); Timothy J. Frey, Syracuse, IN (US); Robert A. Vandal, Syracuse, IN (US)

(73) Assignee: Guardian Industries Corp., Auburn Hills, MI (US)

( * ) Notice: Subject to any disclaimer, the term of this patent is extended or adjusted under 35 U.S.C. 154(b) by 209 days.

(21) Appl. No.: 13/449,623

(22) Filed: Apr. 18, 2012

(65) Prior Publication Data

US 2012/0260974 A1   Oct. 18, 2012

Related U.S. Application Data

(63) Continuation-in-part of application No. 12/926,058, filed on Oct. 22, 2010.

(51) Int. Cl.
| | | |
|---|---|---|
| H01L 21/00 | (2006.01) | |
| H01L 31/0203 | (2014.01) | |
| H01L 31/0224 | (2006.01) | |
| H01L 31/0232 | (2014.01) | |
| B32B 17/10 | (2006.01) | |
| C03B 23/025 | (2006.01) | |
| H01L 31/048 | (2014.01) | |

(52) U.S. Cl.
CPC ......... *C03B 23/025* (2013.01); *B32B 17/10761* (2013.01); *B32B 17/10788* (2013.01); *H01L 31/0488* (2013.01); *B32B 17/10119* (2013.01); *B32B 17/10036* (2013.01); *Y02E 10/50* (2013.01); *B32B 2457/12* (2013.01); *Y02T 10/88* (2013.01)

USPC ............... 156/251; 156/259; 438/64; 438/65; 438/71; 438/98; 257/434

(58) Field of Classification Search
USPC .................. 156/251, 259; 438/64, 65, 71, 98; 257/434
See application file for complete search history.

(56) References Cited

U.S. PATENT DOCUMENTS

| 4,364,766 A | 12/1982 | Nitschke |
|---|---|---|
| 4,686,321 A | 8/1987 | Kishi |

(Continued)

FOREIGN PATENT DOCUMENTS

| BE | 1 013 036 | 8/2001 |
|---|---|---|
| DE | 42 01 571 | 8/1992 |

(Continued)

OTHER PUBLICATIONS

U.S. Appl. No. 12/926,058, filed Oct. 22, 2010; Vandal et al.

(Continued)

*Primary Examiner* — Evan Pert
(74) *Attorney, Agent, or Firm* — Nixon & Vanderhye P.C.

(57) ABSTRACT

Certain example embodiments relate to techniques for creating improved photovoltaic (PV) modules. In certain example embodiments and first and second glass substrate are provided. A PV array is provided between the first and second glass substrates. The first and second substrates are laminated together with the PV array between the glass substrates. In certain example embodiments the PV module is dimensioned to be similar to an existing roof system (e.g., a sunroof) in a vehicle. In certain example embodiments, holes are provided in a PV module sandwiched between two substrates, the holes being shaped and arranged within the PV module so as to allow light transmission into the vehicle at desired level while still being substantially filled by the laminate or adhesive material used to secure the PV module to the two surrounding substrates.

23 Claims, 15 Drawing Sheets

(56) References Cited

U.S. PATENT DOCUMENTS

| | | | |
|---|---|---|---|
| 4,795,500 A | 1/1989 | Kishi et al. | |
| 5,030,594 A | 7/1991 | Heithoff | |
| 5,383,990 A | 1/1995 | Tsuji | |
| 5,443,669 A | 8/1995 | Tünker | |
| 5,602,457 A * | 2/1997 | Anderson et al. | 320/102 |
| 6,009,726 A | 1/2000 | Funk | |
| 6,123,824 A | 9/2000 | Sano et al. | |
| 6,158,247 A | 12/2000 | Didelot | |
| 6,240,746 B1 | 6/2001 | Maeda et al. | |
| 6,288,325 B1 | 9/2001 | Jansen et al. | |
| 6,318,125 B1 | 11/2001 | Diederen et al. | |
| 6,321,570 B1 | 11/2001 | De Vries, Jr. et al. | |
| 6,538,192 B1 | 3/2003 | Coster et al. | |
| 6,613,603 B1 | 9/2003 | Sano | |
| 6,784,361 B2 | 8/2004 | Carlson et al. | |
| 6,983,104 B2 | 1/2006 | Longobardo et al. | |
| 7,082,260 B2 | 7/2006 | Longobardo et al. | |
| 7,140,204 B2 | 11/2006 | Vandal | |
| 7,557,053 B2 | 7/2009 | Thomsen et al. | |
| 2004/0261841 A1 | 12/2004 | Negami et al. | |
| 2006/0112987 A1 | 6/2006 | Nakata et al. | |
| 2006/0169316 A1 | 8/2006 | Thomsen et al. | |
| 2006/0180200 A1 | 8/2006 | Platzer Bjorkman et al. | |
| 2006/0249199 A1 | 11/2006 | Thomsen et al. | |
| 2007/0131272 A1 | 6/2007 | Lim et al. | |
| 2007/0215205 A1 | 9/2007 | Thomsen et al. | |
| 2008/0178925 A1 | 7/2008 | Wu et al. | |
| 2008/0308147 A1 | 12/2008 | Lu et al. | |
| 2009/0217978 A1 | 9/2009 | Thomsen et al. | |
| 2009/0223252 A1 | 9/2009 | Fulton et al. | |
| 2010/0122728 A1 | 5/2010 | Fulton et al. | |
| 2010/0154477 A1 | 6/2010 | Thomsen et al. | |
| 2010/0255980 A1 | 10/2010 | Fulton et al. | |
| 2011/0017280 A1 | 1/2011 | Rumsby | |

FOREIGN PATENT DOCUMENTS

| | | |
|---|---|---|
| DE | 10 2009 022 378 | 1/2011 |
| EP | 1 638 150 | 3/2006 |
| EP | 1 923 919 | 5/2008 |

OTHER PUBLICATIONS

International Search Report mailed Aug. 13, 2013.

* cited by examiner

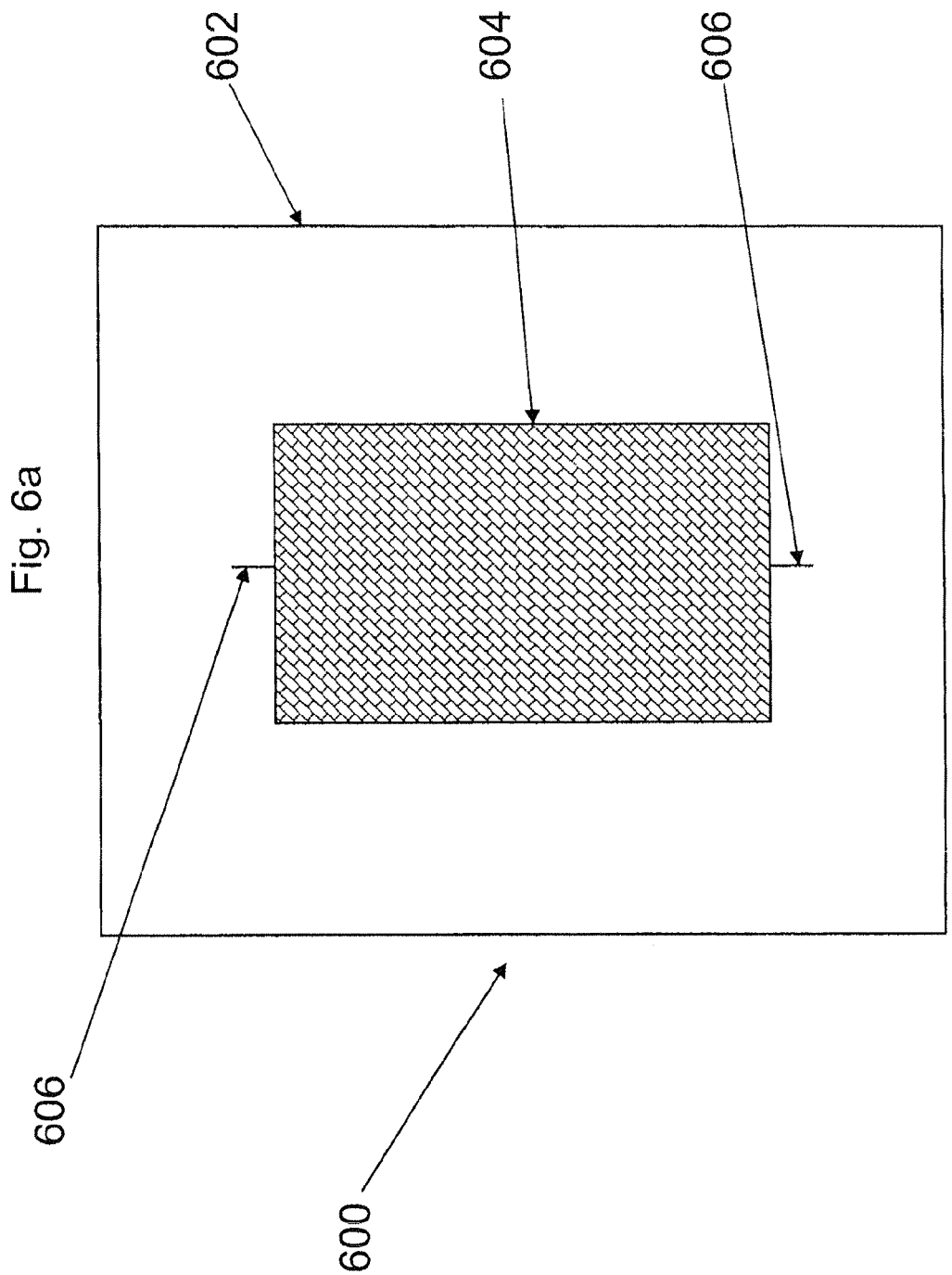

PHOTOVOLTAIC MODULES FOR USE IN VEHICLE ROOFS, AND/OR METHODS OF MAKING THE SAME

This application is a continuation-in-part (CIP) of U.S. application Ser. No. 12/926,058 filed on Oct. 22, 2010, the entire contents of which are hereby incorporated by reference herein.

FIELD OF THE INVENTION

Certain example embodiments of this invention relate to improved photovoltaic (PV) modules for use in vehicle roofs, and/or methods of making the same. More particularly, certain example embodiments relate to PV modules for use on automotive, recreational, marine, and/or other vehicles, and/or methods of making the same. In certain example embodiments, holes are provided in a PV module sandwiched between two substrates, the holes being shaped and arranged within the PV module so as to allow light transmission into the vehicle at desired level while still being substantially filled by the laminate or adhesive material used to secure the PV module to the two surrounding substrates.

BACKGROUND AND SUMMARY OF EXAMPLE EMBODIMENTS OF THE INVENTION

Photovoltaic (PV) devices are known in the art (e.g., see U.S. Patent Document Nos. 2004/0261841, 2006/0180200, 2008/0308147; U.S. Pat. Nos. 6,784,361, 6,288,325, 6,613,603, and 6,123,824, the disclosures of which are each hereby incorporated herein by reference).

The use of many current PV devices has been confined to relatively stationary emplacements, such as on the roof of a home or as a part of a larger power plant. Indeed, in certain cases, skyscrapers have been effectively sheathed in PV cells. In recent years, attempts have been made to install PV devices onto more movable devices such as automobiles or boats. One area of focus has been in equipping PV devices onto the roof of a car and/or the sunroof of a car. The addition of a solar sun roof may allow, for example, a car to run a ventilation system when the car is parked in the hot summer sun.

In an example conventional process, the glass used for a sunroof may be installed in a vehicle as part of an overall manufacturing and/or assembly process. The dimensions and shape of the sunroof may be designed ahead of time to meet the structural and design specifications of the vehicle in which the sunroof is to be installed. For example, a sunroof for a car may be curved or flat depending on the specifications of the car manufacturer and/or shape and structure of the car.

While the design aspect of a sunroof may be addressed before final assembly, vehicle manufactures may still have to modify the overall design to accommodate a sunroof. For example, as is known, the addition of a sunroof as a "built in" feature of a car may require a reduction in the overall headroom available within the passenger compartment of the car. Further, the roof of the car may need to be modified in order to accommodate a sunroof (e.g., when the sunroof is in an open position) in certain cases. These structural changes to the car may sometimes increase both the cost and complexity of manufacturing.

Conventionally, equipping a PV device used in transportation (e.g., as a sunroof add-on) may involve adding a single piece of flat or curved tempered glass with a flat commercial PV device attached or mounted directly behind the tempered glass (e.g., on the inside of a sunroof). However, this conventional approach for attaching PV devices to sunroofs may be problematic, e.g., because of the difficulties involved in adding to a sunroof a component that does not necessarily "fit," forming any necessary or desirable electrical connections, matching the size and/or shape of the PV module to the sunroof and/or rooftop, maintaining the desirable structural integrity of the rooftop, etc.

It also will be appreciated that the addition of the PV device to a traditional glass sunroof may increase the overall weight of the vehicle. This increased weight from the PV device attached to the sunroof may adversely affect the performance of the vehicle. Thus, any potential efficiency benefit in providing a PV sunroof may be offset by the increased weight of the car from the addition of the PV device. Further, the additional weight at such a high point in the car may increase the overall center of gravity of the car. This may in turn lead to safety problems (e.g., a higher risk of turn over).

Furthermore, as alluded to above, integrating the newly installed PV device into the structure of the car may require modification of the body of the car because it may not "fit" without such modifications. For example, a traditional sunroof may be adapted to fit into an insert of the roof when the sunroof is open. However, the addition of a PV device with its additional thickness may preclude the modified sunroof from retracting into the body of the roof.

Car manufactures may be able to compensate for this problem by designing car roofs to accommodate sunroofs with PV devices. However, this solution may create more problems. For example, this additional modification to the body of the car may increase the cost and complexity of manufacturing. The additional body modification may add to the at least two body structures already being produced for the car (e.g., one with a sunroof and one without). The additional thickness of the PV device also may further reduce the already reduced headroom provided in the passenger compartment of the car.

In addition, because the PV device may come from a supplier other than a normal sunroof supplier, the addition of the PV device may add more assembly steps and more complexity to the overall manufacturing process. Instead of just installing a sunroof during assembly, a car manufacturer may instead have to install a sunroof and then install the PV device. It will be appreciated that this convention PV installation may require a retooling of a production line.

The aftermarket installation of a PV device may also present additional problems or complications. For already manufactured cars, the addition of a PV device (with its corresponding thickness) to the sunroof may require expensive after market customization including a re-structuring of the roof of the car.

Thus, it will be appreciated that techniques for improved PV use with roofs, sunroofs, and/or the like are continuously sought after. It also will be appreciated that there exists a need in the art for improved PV modules and the like that, for example, can be efficiently installed with or instead of a sunroof in a car.

In certain example embodiments, a method of making an integrated photovoltaic (PV) module for use in a vehicle is provided. A first low-iron glass substrate is provided, with the first substrate having a thickness of between about 1.5-3.5 mm. A second glass substrate is substantially parallel to the first substrate, with the second substrate having a thickness between about 1.5 and 3.5 mm, A PV array is provided between a major surface of the first glass substrate and a major surface of the second glass substrate. The first and second substrates are laminated together with the PV array therebetween. The PV module is dimensioned, shaped, and structured to weigh according to a predetermined dimensions, shape, and weight in relation to the roof of the vehicle.

In certain example embodiments, a method of making an integrated PV module for a rooftop a vehicle is provided. A first glass substrate having a first thickness is provided. A second glass substrate is substantially parallel to the first substrate and has a second thickness. The second substrate has a higher iron content and lower visible transmission than the first substrate. A solar cell array is inserted between the first and second glass substrates. The first and second glass substrates are laminated together with the solar cell array therebetween.

According to certain example embodiments, a method of making a vehicle is provided. An integrated PV module according is provided and built into the vehicle. The vehicle may be an automobile, truck, tractor, boat, plane, etc.

In certain example embodiments, an integrated PV module configured to replace an existing sunroof is provided. A first glass substrate has a thickness of 1.5-3.5 mm. A second glass substrate is substantially parallel to the first substrate and has more iron and a lower visible transmission than the first substrate. A CIGS-based solar cell array is disposed between a major surface of the first glass substrate and a major surface of the second glass substrate, with the thin film solar cell array having electrical leads connected thereto. The first and second substrates are laminated together with PVB. The PVB seals the solar cell array between the first and second substrates, and the electrical leads extend through the PVB and out of the integrated PV module. The integrated PV module is dimensioned to be structurally similar to the existing sunroof.

In certain example embodiments laminating PV cells between two glass substrates and two pieces of laminate material may provide safety and acoustical benefits. Alternatively, or in addition to, the laminated PV module may preserve the PV cells both through UV filtering as will as mechanical protection.

In certain example embodiments the use of flexible CIGS thing film PV cells in a laminate allows the PV module to be shaped in a manner similar or equal to the curvature as other automotive or transportation roof systems.

In certain example embodiments the integrated PV module may be similar to normal roof glass for vehicles. Differences may include that the PV module contains electrical connections for the PV cells and that the PV cells of the PV module may generate electricity for use in vehicle systems.

In certain example embodiments the PV module with included glass substrates, PV cells, and laminates may be similar in weight to standard glass roof systems for vehicles. Further, replacement of standard glass roof systems with an integrated PV module may provide safety and efficiency benefits to the passengers and car.

In certain example embodiments, a method of making an integrated photovoltaic (PV) module for use in a vehicle is provided. First and second glass substrates are provided. A PV module is provided, with the PV module having a plurality of through-holes formed therein. The first and second glass substrates are laminated together with the PV module therebetween. During said laminating, laminating material is allowed to at least substantially fill the plurality of through-holes in the PV module as a result of the through-holes' size, shape, and placement. The through-holes collectively have a total area selected so as to allow visible transmission through the integrated PV module to reach a selected target value.

In certain example embodiments, a method of making a vehicle is provided. An integrated photovoltaic (PV) module made by the example methods described herein is provided, and the integrated PV module is built into the vehicle.

In certain example embodiments, a method of making a photovoltaic (PV) module is provided. A substrate with a plurality of solar cells formed thereon is provided. A grid of conductive material is provided on the substrate. A plurality of through-holes are formed in the substrate in a pattern such that (a) the through-holes collectively have a total area selected so as to allow visible transmission through an integrated PV module in which the PV module is disposed to reach a selected target value, and (b) the through-holes have an aspect ratio and a positioning sufficient to allow laminating material used in making the integrated PV module to flow therein and substantially fill the through-holes.

In certain example embodiments, an integrated photovoltaic (PV) module for use in a vehicle is provided. First and second glass substrates are provided. A PV module includes a plurality of spaced apart solar cells and has a plurality of through-holes formed therein. The PV module is interposed between the first and second glass substrates. A plurality of collection lines are formed on the substrate and between adjacent solar cells. The PV module is laminated to the first and second substrates such that the plurality of through-holes in the PV module are substantially filled with laminating material as a result of the through-holes' size, shape, and placement. The through-holes collectively have a total area selected so as to allow visible transmission through the integrated PV module to reach a selected target value.

The features, aspects, advantages, and example embodiments described herein may be combined in any suitable combination or sub-combination to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which:

FIG. 6a is an illustrative plan view showing an exemplary installation of a PV module in a roof of an automobile in accordance with an example embodiment;

DETAILED DESCRIPTION OF EXAMPLE EMBODIMENTS OF THE INVENTION

Certain example embodiments may relate to PV modules comprising two glass substrates, a PV layer disposed therebetween, and a bonding agent to bond the glass substrates and the PV layer together into one integrated PV module.

PV devices come in many forms. One area of PV devices is Thin Film Solar Cells (TFSC). Examples of TFSC devices include CIGS (Cu(In, Ga)(Se, S)$_2$) and CIS (CuInSe$_2$) solar cells.

CIGS and CIS type photovoltaic devices may include, from the front or light incident side moving rearwardly, a front substrate of a material such as glass, a front electrode comprising a transparent conductive layer such as a TCO (transparent conductive oxide), a light absorption semiconductor film (e.g., CIGS and/or CIS film), a rear electrode, and a rear substrate of a material such as glass. Sometimes an adhesive is provided between the front substrate and the front electrode, and it is also possible for window layer(s) (e.g., of or including CdS, ZnO, or the like) to be provided. Photovoltaic power is generated when light incident from the front side of the device passes through the front electrode and is absorbed by the light absorption semiconductor film as is known in the art.

The layers in TFSC devices may range from between a few nanometers to a few micrometers. However, certain problems may arise when using TFSC in a PV installation. First, the materials used in certain TFSC cells (e.g., indium, gallium, cadmium) may be potentially harmful to humans. Further, certain TFSC elements may be adversely affected by the outside environment. For example, elements in CIGS may suffer degradation and may lead to a reduced life span and/or efficiency of the solar cell when exposed to damp conditions. Accordingly, it will be appreciated that protecting TFSC cells from the outside environment and protecting the outside environment (e.g., humans) from TFSC elements may be desirable.

Figure 1:
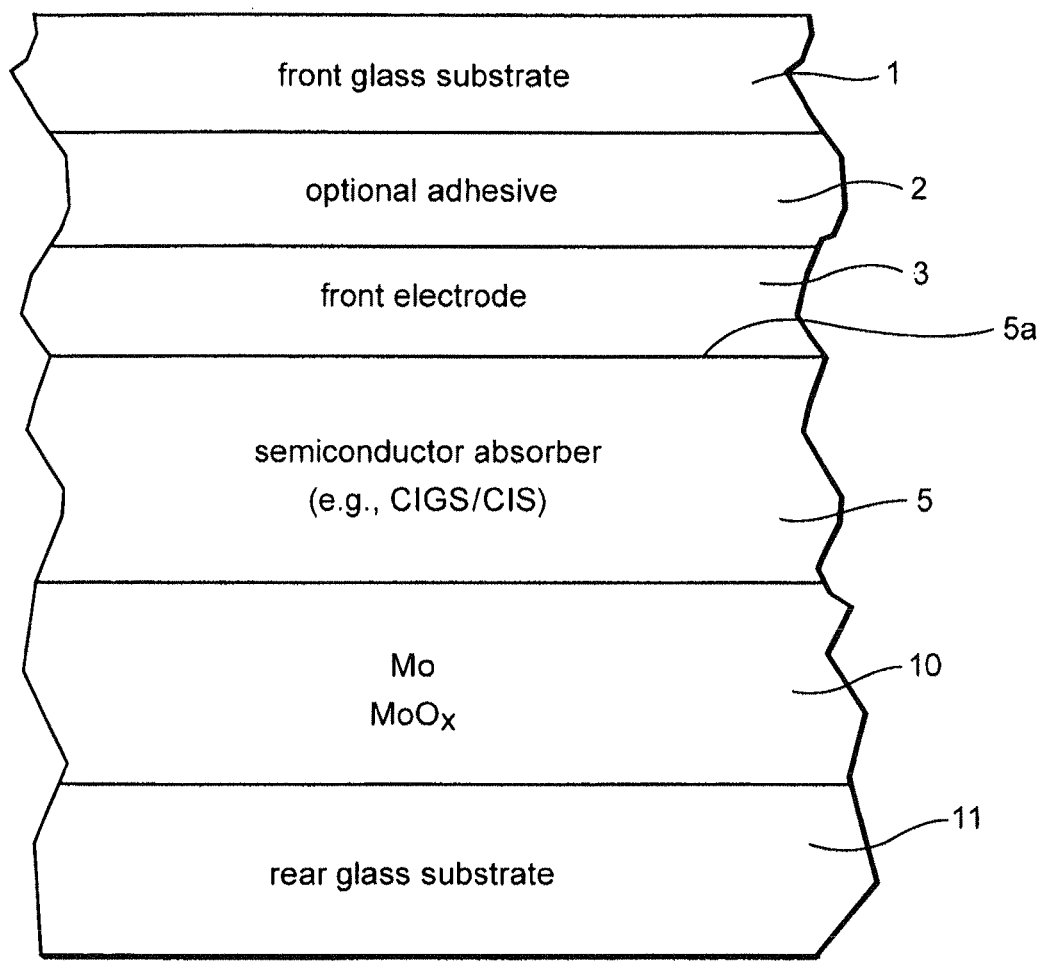
FIG. 1 is an illustrative cross-sectional view of an example photovoltaic device according to an example embodiment.

Referring now more particularly to the drawings in which like reference numerals indicate like parts throughout the several views. FIG. 1 includes transparent front glass substrate 1, optional adhesive film 2, single layer or multilayer front conductive electrode 3, active semiconductor film 5 of or including one or more semiconductor layers (such as CIGS, CIS, or the like), electrically conductive back electrode/reflector 10, and rear glass substrate 11. The light incident surface 5a of the semiconductor film 5 may or may not be textured in different embodiments of this invention. Rear electrode 10 is preferably continuous or substantially continuous across all or a substantial portion of glass substrate 11, although it may be patterned into a desired design (e.g., stripes) in certain instances. The optional adhesive 2 may be of or include an electrically insulating polymer based and/or polymer inclusive encapsulant or adhesive of a material such as ethyl vinyl acetate (EVA), polyvinyl butyral (PVB), or the like. In certain example embodiments, polymer based adhesive layer 2 has a refractive index (n) of from about 1.8 to 2.2, more preferably from about 1.9 to 2.1, with an example being about 2.0, for purposes of enhancing internal reflection if textural back glass is used. Of course, other layer(s) that are not shown may also be provided in the device. For instance, buffer and/or window layer(s) may also optionally be provided.

A metal such as Mo (molybdenum) may be used as the rear electrode (bottom contact) 10 of a photovoltaic device, such as a CIS solar cell. In certain instances, the Mo may be sputter-deposited onto a soda or soda-lime-silica rear glass substrate 11 of the photovoltaic device. Rear electrodes (e.g., Mo rear electrodes) 10 preferably have low stress, high conductivity, and good adhesion to the rear substrate (e.g., glass substrate) 11. In order to provide this combination of features, oxygen is introduced into the Mo based rear electrode 10 at the initial stage of deposition of the rear electrode on the substrate 11 or otherwise in certain example embodiments of this invention. The application of the oxygen to the Mo-based rear electrode 10 reduces the overall stress of the rear electrode and at the same time promotes adhesion of the rear electrode 10 to the glass soda or soda lime silica glass substrate 11. However, in certain large sputter coaters designed for large substrate widths such as greater than one meter, it is sometimes difficult to control the uniformity of oxygen in the final rear electrode film due to the different pumping speeds between reactive gas (e.g., oxygen) and sputtering gas (e.g., Ar). In the FIG. 1 embodiment, the Mo-based rear electrode (which may be oxidation graded) is supported by a substantially flat surface of the rear substrate 11. However, in other example embodiments, the rear electrode may be formed on a textured surface of the rear substrate 11.

Figure 2A:
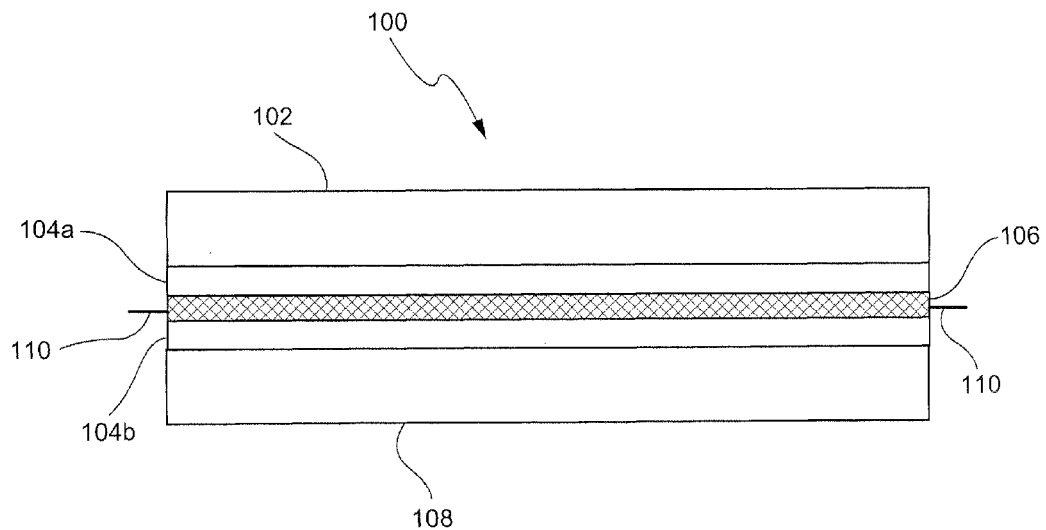
FIG. 2a is an illustrative cross-sectional view showing the components of an exemplary PV module in accordance with an example embodiment.

FIG. 2a is an illustrative cross-sectional view showing the components of an exemplary PV module in accordance with an example embodiment. A PV module 100 with a first glass substrate 102 may be provided. A second glass substrate 108 on the underside of PV module 100 (e.g., opposite where the sun impinges on the PV module 100) may be provided. One or more functional PV layer(s) 106 may be disposed between the first glass substrate 102 and the second glass substrate 108. For instance, in certain example embodiments, the functional PV layer(s) 106 may be supported by the second substrate 108. First and second laminating materials 104a and 104b may be used to laminate together the first and second substrates 102 and 108. Thus, the front substrate 1 in FIG. 1 may be the outer substrate 102 in FIG. 2, the rear glass substrate 11 in FIG. 1 may be the second substrate 108 in FIG. 2, and optional adhesive layer 2 in FIG. 1 may be first the laminating material 104a in FIG. 4, and the functional PV layers 106 in FIG. 2 may be of or include layers 2, 3, 5, and 10 from FIG. 1. However, unlike the FIG. 1 example arrangement, a second laminating material 104b may be provided. In certain example embodiments a PV layer 106 may include PV layers (e.g., layers 2, 3, 5, and/or 10) disposed (e.g., deposited) onto a film such as a thin stainless steel foil or a conductive coated polymer. Other substrates and/or materials may be used in different embodiments of this invention.

Figure 2B:
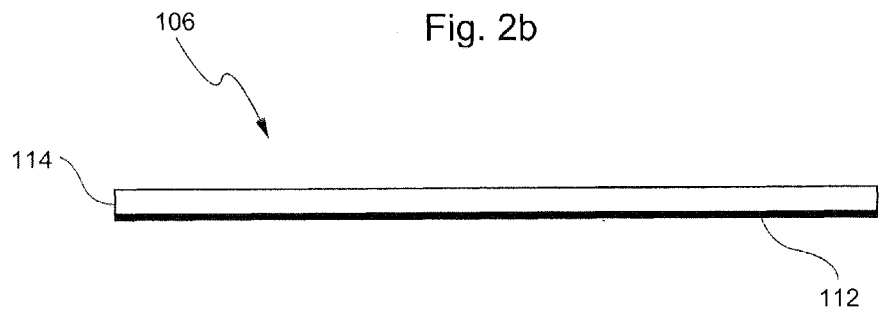
FIG. 2b is an illustrative cross-sectional view showing the components of an exemplary PV layer in accordance with an example embodiment.

FIG. 2b is an illustrative cross-sectional view showing the components of an exemplary PV layer in accordance with an example embodiment. A PV layer 106 may include a disposed PV material 114 (e.g., CIGS) onto a substrate 112. The substrate may, for example, be a stainless steel foil. In certain example embodiments, PV layer 106 may have a width of less than 1 mm, more preferably less than 0.7 mm, and sometimes of about 0.5 mm.

The laminating materials 104a and 104b may help to both laminate together the first and second substrate 102 and 108, and encapsulate the PV layer(s) 106. The laminating materials 104a and 104b may be composed of a material such as polyvinyl butyral (PVB) or ethylene-vinyl acetate (EVA) of a thickness between about 0.38 mm and 0.76 mm. UV curable liquid urethanes may also be used as a laminated material in certain example embodiments. The laminating may be accomplished using conventional techniques including, for example, heat and/or pressure based laminating techniques, exposure to UV radiation (e.g., for UV-curable materials), etc. Sandwiching the PV layers 106 with first and second laminating materials 104a and 104b may be advantageous in certain example embodiments, as it may allow the PV module to be more flexible and/or adaptable for insertion in between the inner and outer substrates of a variety of differently sized and/or shaped sunroofs. The first and second laminating materials 104a and 104b may be the same or different laminating materials in different embodiments of this invention.

PV layer 106 may contain a layout of PV cells that may be interconnected by copper conductive ribbon strips. In certain example embodiments, the PV cells may be single junction solar cells. Alternatively, PV cells may be multi or tandem junction solar cells. Electrical connections to the PV cells may be made via a conductive adhesive, solder, or the like. Two or more ribbon leads 110 may extend outwardly from one or more edges of the PV module 100, e.g., to interface with desired applications (e.g., an energy grid, an appliance such as, for example, a fan or air conditioner, a deep cycle battery array for storage, the drive battery for a hybrid or electric vehicle, etc). It will be appreciated that in other example embodiments, there may be one ribbon lead extending from the PV module. In certain other example embodiment there may be two ribbon leads extending from one point along the edge of the PV module.

The thickness of the glass substrates may be between about 1.5 to 3.5 mm. However, the overall thickness, weight, and durability options for glass substrates 102 and 108 and the PV module 100 may vary with specific application considerations for the PV module. For example, a PV module installed on a sailboat may need to be more durable (e.g., to resist conditions that may come about when at sea) than one installed in the sunroof of a car. For instance, in certain example embodiments, glass substrate 102 may have a thickness of around 2.0 mm and glass substrate 108 may have a thickness of around 1.6 mm.

The two glass substrate 102 and 108 may include a printed pattern on either major surface. The pattern may frame the PV cells of the PV layer 106 and may hide the gaps and interconnections of the PV layer from view, for example. The pattern may be formed from a fired ceramic frit, enamel, or other appropriate material for application to the glass substrates. For example, a UV cured acrylate or organic material may be used on the inner surfaces of the glass substrates. These and/or other materials may be screen printed on the desired surface in the desired locations to form the desired pattern in certain example embodiments.

The two glass substrates 102 and 108 may be of various thickness and color. As it may be desirable to provide reduced impedance for light travel to the PV layer 106, a high transmission type glass may be desirable for glass substrate 102. High transmission, low iron glass may be used in certain example embodiments. See, for example, U.S. Pat. Nos. 7,700,870; 7,557,053; and 5,030,594 and U.S. Publication Nos. 2006/0169316; 2006/0249199; 2007/0215205; 2009/0223252; 2010/0122728; 2009/0217978; and 2010/0255980, the entire contents of each of which are hereby incorporated herein by reference.

An exemplary soda-lime-silica base glass according to certain example embodiments, on a weight percentage basis, includes the following basic ingredients:

TABLE 1

EXAMPLE BASE GLASS

| Ingredient | Wt. % |
|---|---|
| $SiO_2$ | 67-75% |
| $Na_2O$ | 10-20% |
| CaO | 5-15% |
| MgO | 0-7% |
| $Al_2O_3$ | 0-5% |
| $K_2O$ | 0-5% |

Other minor ingredients, including various conventional refining aids, such as $SO_3$, carbon, and the like may also be included in a base glass. In certain embodiments, for example, glass herein may be made from batch raw materials silica sand, soda ash, dolomite, limestone, with the use of sulfate salts such as salt cake ($Na_2SO_4$) and/or Epsom salt ($MgSO_4 \times 7H_2O$) and/or gypsum (e.g., about a 1:1 combination of any) as refining agents. In certain example embodiments, soda-lime-silica based glasses herein include by weight from about 10-15% $Na_2O$ and from about 6-12% CaO.

In addition to the base glass (e.g., see Table 1 above), in making glass according to certain example embodiments the glass batch includes materials (including colorants and/or oxidizers) which cause the resulting glass to be fairly neutral in color (slightly yellow in certain example embodiments, indicated by a positive b* value) and/or have a high visible light transmission. These materials may either be present in the raw materials (e.g., small amounts of iron), or may be added to the base glass materials in the batch (e.g., antimony and/or the like). In certain example embodiments, the resulting glass has visible transmission of at least 75%, more preferably at least 80%, even more preferably of at least 85%, and most preferably of at least about 90% (sometimes at least 91%) (Lt D65).

In certain embodiments, in addition to the base glass, the glass and/or glass batch comprises or consists essentially of materials as set forth in Table 2 below (in terms of weight percentage of the total glass composition):

TABLE 2

EXAMPLE ADDITIONAL MATERIALS IN GLASS

| Ingredient | General (Wt. %) | More Preferred | Most Preferred |
|---|---|---|---|
| total iron (expressed as $Fe_2O_3$) | 0.001-0.06% | 0.005-0.045% | 0.01-0.03% |

TABLE 2-continued

EXAMPLE ADDITIONAL MATERIALS IN GLASS

| Ingredient | General (Wt. %) | More Preferred | Most Preferred |
|---|---|---|---|
| % FeO | 0-0.0040% | 0-0.0030% | 0.001-0.0025% |
| glass redox (FeO/total iron) | <=0.10 | <=0.06 | <=0.04 |
| cerium oxide | 0-0.07% | 0-0.04% | 0-0.02% |
| antimony oxide | 0.01-1.0% | 0.01-0.5% | 0.1-0.3% |
| $SO_3$ | 0.1-1.0% | 0.2-0.6% | 0.25-0.5% |
| $TiO_2$ | 0-1.0% | 0.005-0.4% | 0.01-0.04% |

In certain example embodiments, the antimony may be added to the glass batch in the form of one or more of $Sb_2O_3$ and/or $NaSbO_3$. Note also $Sb(Sb_2O_5)$. The use of the term antimony oxide herein means antimony in any possible oxidation state, and is not intended to be limiting to any particular stoichiometry.

The low glass redox evidences the highly oxidized nature of the glass. Due to the antimony (Sb), the glass is oxidized to a very low ferrous content (% FeO) by combinational oxidation with antimony in the form of antimony trioxide ($Sb_2O_3$), sodium antimonite ($NaSbO_3$), sodium pyroantimonate (Sb ($Sb_2O_5$)), sodium or potassium nitrate and/or sodium sulfate. In certain example embodiments, the composition of the glass substrate includes at least twice as much antimony oxide as total iron oxide, by weight, more preferably at least about three times as much, and most preferably at least about four times as much antimony oxide as total iron oxide.

In certain example embodiments, the colorant portion is substantially free of other colorants (other than potentially trace amounts). However, it should be appreciated that amounts of other materials (e.g., refining aids, melting aids, colorants and/or impurities) may be present in the glass in certain other embodiments without. For instance, in certain example embodiments, the glass composition is substantially free of, or free of one, two, three, four or all of: erbium oxide, nickel oxide, cobalt oxide, neodymium oxide, chromium oxide, and selenium. The phrase "substantially free" means no more than 2 ppm and possibly as low as 0 ppm of the element or material.

The total amount of iron present in the glass batch and in the resulting glass, i.e., in the colorant portion thereof, is expressed herein in terms of $Fe_2O_3$ in accordance with standard practice. This, however, does not imply that all iron is actually in the form of $Fe_2O_3$ (see discussion above in this regard). Likewise, the amount of iron in the ferrous state ($Fe^{+2}$) is reported herein as FeO, even though all ferrous state iron in the glass batch or glass may not be in the form of FeO. As mentioned above, iron in the ferrous state ($Fe^{2+}$; FeO) is a blue-green colorant, while iron in the ferric state ($Fe^{3+}$) is a yellow-green colorant; and the blue-green colorant of ferrous iron is of particular concern, since as a strong colorant it introduces significant color into the glass which can sometimes be undesirable when seeking to achieve a neutral or clear color.

In view of the above, glasses according to certain example embodiments achieve a neutral or substantially clear color and/or high visible transmission. In certain embodiments, resulting glasses according to certain example embodiments may be characterized by one or more of the following transmissive optical or color characteristics when measured at a thickness of from about 1 mm-6 mm (most preferably a thickness of about 3-4 mm; this is a non-limiting thickness used for purposes of reference only) (Lta is visible transmission %). It is noted that in the table below the a* and b* color values are determined per Ill. D65, 10 degree Obs.

TABLE 3

GLASS CHARACTERISTICS OF EXAMPLE EMBODIMENTS

| Characteristic | General | More Preferred | Most Preferred |
|---|---|---|---|
| Lta (Lt D65): | >=85% | >=90% | >=91% |
| % τe (ISO 9050): | >=85% | >=90% | >=91% |
| % FeO (wt. %): | <=0.004% | <=0.003% | <=0.0020% |
| L* (Ill. D65, 10 deg.): | 90-99 | n/a | n/a |
| a* (Ill. D65, 10 deg.): | −1.0 to +1.0 | −0.5 to +0.5 | −0.2 to 0.0 |
| b* (Ill. D65, 10 deg.): | 0 to +1.5 | +0.1 to +1.0 | +0.2 to +0.7 |

Figure 3:
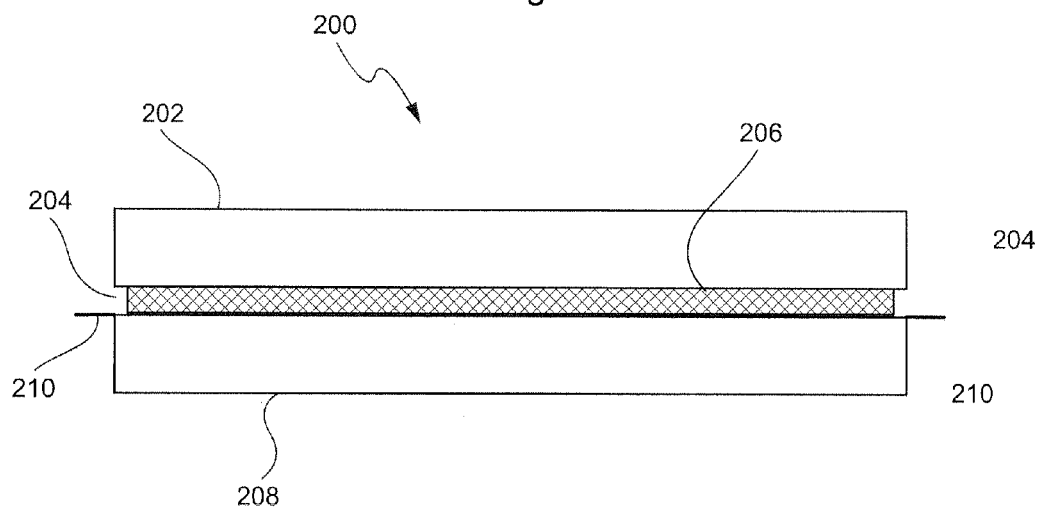
FIG. 3 is an illustrative cross-sectional view of a exemplary PV module after bonding has taken place in accordance with an example embodiment.

FIG. 3 is an illustrative cross-sectional view showing an exemplary PV module after bonding has taken place in accordance with another example embodiment. PV module 200 may include glass substrates 202 and 208 with a PV layer 206 disposed therebetween. The PV layer 206 may be dimensioned smaller than glass substrates 202 and 208. After laminating PV module 200, laminate material 204 may form a seal around the outer edges of the first glass substrate 202 and the second glass substrate 208. In the FIG. 3 example view, the laminate material 204 is shown only at the periphery of the glass substrates 202 and 208. However, in different embodiments, the laminate may be provided along substantially all of the first and/or second substrates 202 and 208 including, for example, at least at the peripheral edges thereof. The laminate 204 may in certain example instances help seal the PV layer from the outside environment. This may help to reduce the likelihood of deterioration of the PV layer (e.g., by keeping moisture away from the PV cells). It also may help to keep the potentially hazardous PV material "inside" the sunroof and away from the outside environment (including any persons in the cabin of the vehicle). Extending out from the PV layer 206 and through the laminated material 204 may be conductive ribbon leads 210. Conductive ribbon leads 210 may interface with outside energy storage units (e.g., a battery) or energy consumers (e.g., a fan).

Figure 4A:
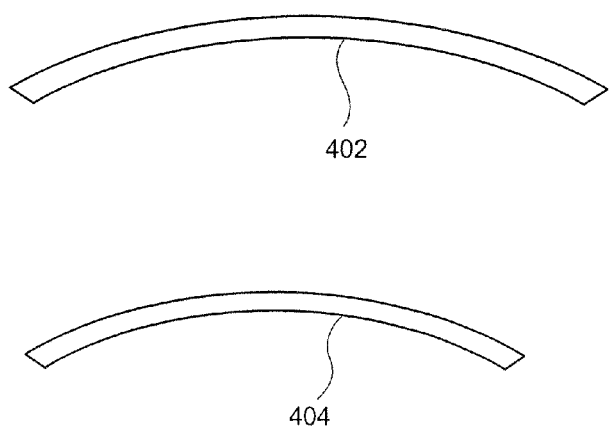
FIG. 4a is an illustrative cross-sectional view of exemplary formed glass substrates in accordance with an example embodiment.
Figure 4B:
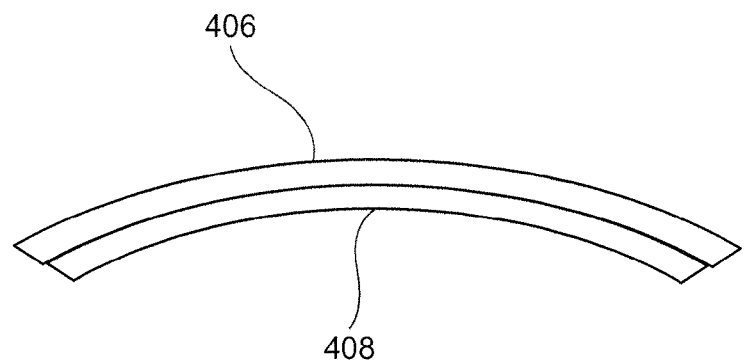
FIG. 4b is an illustrative cross-sectional view of exemplary formed glass substrates in accordance with an example embodiment.

FIG. 4a is an illustrative cross-sectional view of exemplary formed glass substrates in accordance with an example embodiment. In certain example embodiments glass substrates 402 and 404 used in example PV modules may be curved. For example, the sunroof of an automobile may be slightly curved. Thus, a PV module replacing a conventional sunroof may be curved in a manner similar to that of a curved sunroof.

Devices and methods for heat bending glass sheets are well known in the art. For example, see U.S. Pat. Nos. 5,383,990; 6,240,746; 6,321,570; 6,318,125; 6,158,247; 6,009,726; 4,364,766; 5,443,669; 7,140,204; 6,983,104; and 7,082,260, of which the entire contents of each are hereby incorporated herein by reference.

Accordingly, glass substrates 402 and 404 may be individually hot-bended. Alternatively, now referring to FIG. 4b where an illustrative cross-sectional view of exemplary formed glass substrates in accordance with an example embodiment is shown, the glass substrates 406 and 408 may be hot-bended as a unit. This may be done for economical reasons (e.g., only one hot bend may be done for two glass substrates) and/or to help provide substantially similar curvatures to the two glass substrates.

Figure 5:
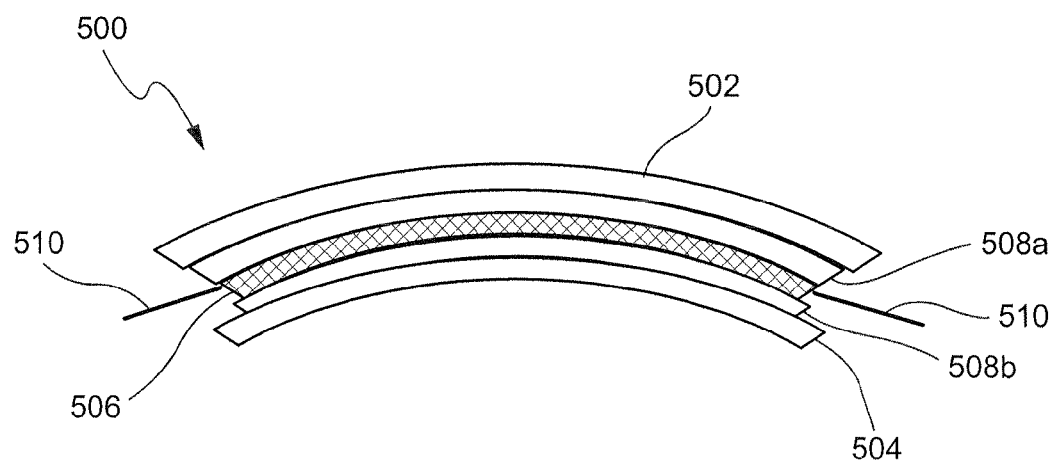
FIG. 5 is an illustrative cross-sectional view of an exemplary PV module in accordance with an example embodiment.

FIG. 5 is an illustrative cross-sectional view of an exemplary PV module after a bonding process in accordance with an example embodiment. PV module 500 may include two curved glass substrates 502 and 504 that are dimensioned and formed as desired, a PV layers 506. As described above, first and second laminating materials 508a and 508b may be used to both laminate together the first and second substrates 502 and 504, as well as encapsulate the PV layers 506. Post bonding, PV module 500 may be structurally similar to one convention piece of glass. Ribbon leads 510 may also be provided to facilitate electrical current transfer from the PV layer 506 for use outside of PV module 500.

FIG. 6 is an illustrative plan view showing an exemplary installation of a PV module installed into a roof an automobile in accordance with an example embodiment. A PV module 604 may be installed into the roof 602 of a car 600. For example, the installation of PV module 604 may replace, or be used instead of, a standard sunroof. Electrical leads 606 connected to a PV layer of the PV module 604 may lead out of the PV module. The electrical leads 606 may then be connected with the electrical systems of the car 600. Alternatively, the electrical leads 606 may be connected to a dedicated device (e.g., a ventilation fan).

A conventional car sitting in a parking lot on a hot summer day may cause the interior of the car to substantially heat up. Conventionally, one option of combating the increased heat built up in the interior of the car is to open the windows to provide a means of egress for the hot air in the car to escape to the outside. One drawback associated with this option is that leaving the windows of the car open may leave the car less secure than with the windows closed. Another conventional option may be to put up a heat shield on the windshield of the car. However, while this option may reduce the rate of heat build up, it may not provide a means of transferring built up heat from the interior of the car to the exterior airspace.

In certain instances a PV module with electrical connections may provide an independent power source to drive a fan, air conditioner, heater, or the like. Thus, electrical leads 606 may be connected to an independent (e.g., not dependent on the car's power systems—battery or engine) efficient air conditioner of car 600. Alternatively, or in addition, the electrical leads 606 may interface with the electrical and power systems of car 600. This may facilitate, for example, usage of the radio, speakers, etc., of the car when the car is not turned and without draining the main car battery.

In certain other example embodiments, a dedicated backup battery may be provided. The electrical leads from a PV module may be connected directly to the backup battery. The PV module may then help to keep the backup battery in a charged state such that the backup battery may be available in emergency situations (e.g., when the main battery in the car dies or run out). It will be appreciated that a PV module may be electrically connected to various other power systems in and out of a vehicle such as, for example, the drive battery system for a hybrid or electric vehicle.

In operation, the PV module 604 installed into the roof 602 of car 600 in place of a sunroof may function in a manner similar to the uninstalled sunroof. In certain example embodiments, the dimensions (e.g., shape, thickness, etc) of the PV module 604 may be substantially similar to that of the uninstalled sunroof. This may facilitate, for example, usage of the PV module as a sunroof such that the PV module may be retracted in a manner similar to a sunroof. In certain example embodiments the electrical leads 606 may be modified to provide a continuous link (e.g., such that electrical connectors extending upwardly from the sunroof and/or downwardly from the frame of the car for a sort of electrically connected track). For example, electrical leads 606 may be extendable such that when PV module 604 is retracted from the roof of the car (e.g., in a manner similar to that of a sunroof) that the electrical leads, even though they are now in a different position in the roof, are still connected. Alternatively, electrical leads may be structured to be in contact with outside electrical sources when the PV module is in a closed position. In other words, when PV module is closed the electrical leads may come into contact with pre-arranged leads. When the PV module is retracted (and the sunroof is open) the electrical leads 606 may be separated from the vehicle electrical system. In other example embodiments, electrical leads may extend from the PV module at the same general location. Such embodiments may facilitate connecting the PV module to external systems (e.g., because the interface to the PV module is in one location). It will be appreciated that other techniques for interfacing the electrical leads of PV module with the car and/or other outside electrical consumers may be implemented.

Figure 6B:
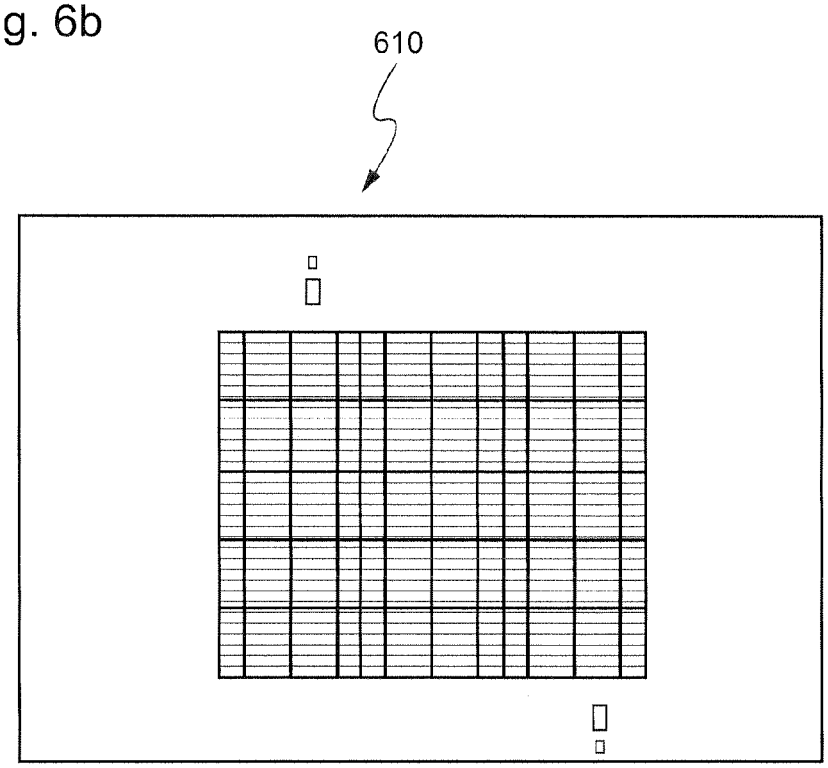
FIGS. 6b, 6c, and 6d are illustrative plan views showing exemplary geometries of PV modules in accordance with example embodiments.
Figure 6C:
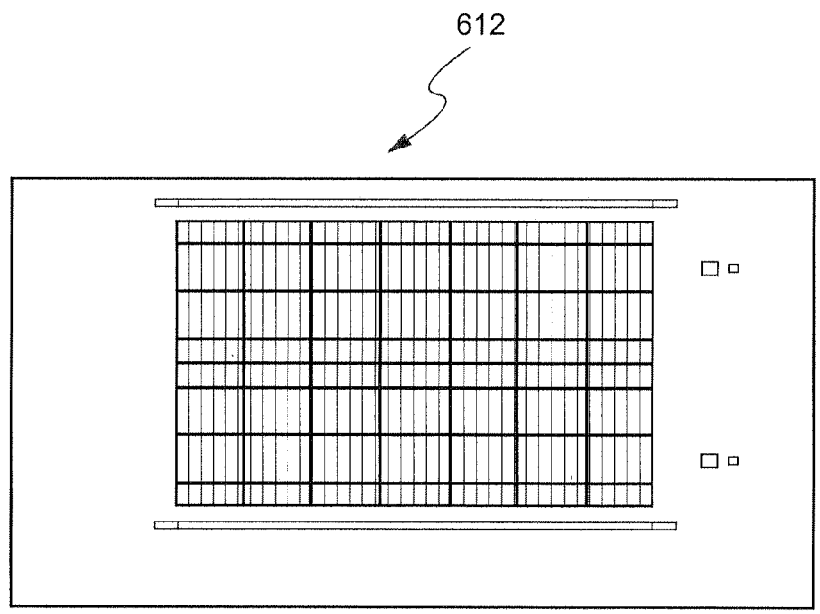
Figure 6D:
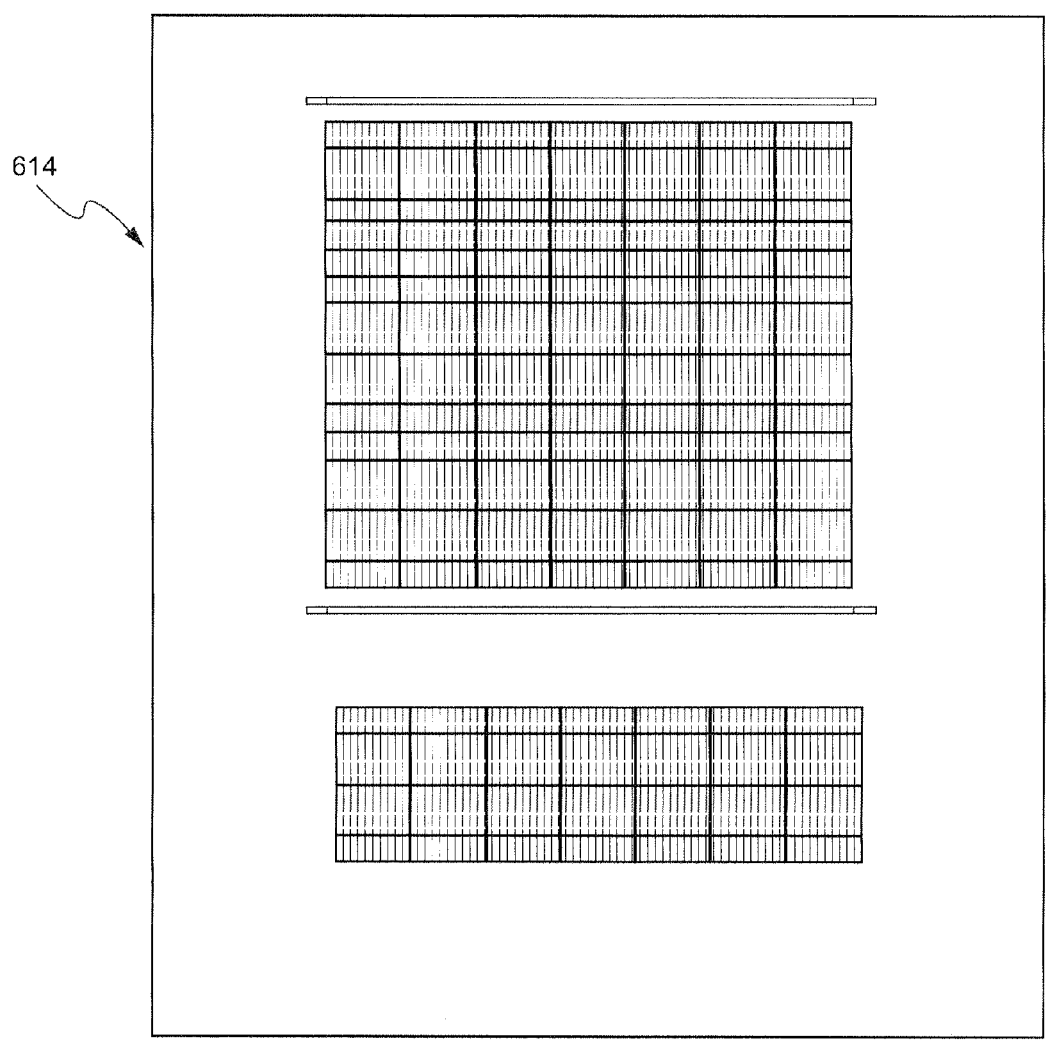

FIGS. 6b, 6c, and 6d are illustrative plan views showing exemplary geometries of PV modules in accordance with example embodiments. It will be appreciated that the grid patterns shown in these drawings and discussed herein are exemplary and that other patterns may be used in different example embodiments of this invention.

PV module 610 is an example 15-string PV assembly. PV module 610 may have a area of about 0.32 square meters and have an estimated power output of around 30 watts (e.g., depending on environmental conditions).

PV module 612 is an example 14-string PV assembly. PV module 612 may have a area of about 0.30 square meters and have an estimated power output of around 28 watts (e.g., depending on environmental conditions).

PV module 614 is an example 28-string PV assembly. PV module 614 may have a area of about 0.61 square meters and have an estimated power output of around 56 watts (e.g., depending on environmental conditions).

Figure 6E:
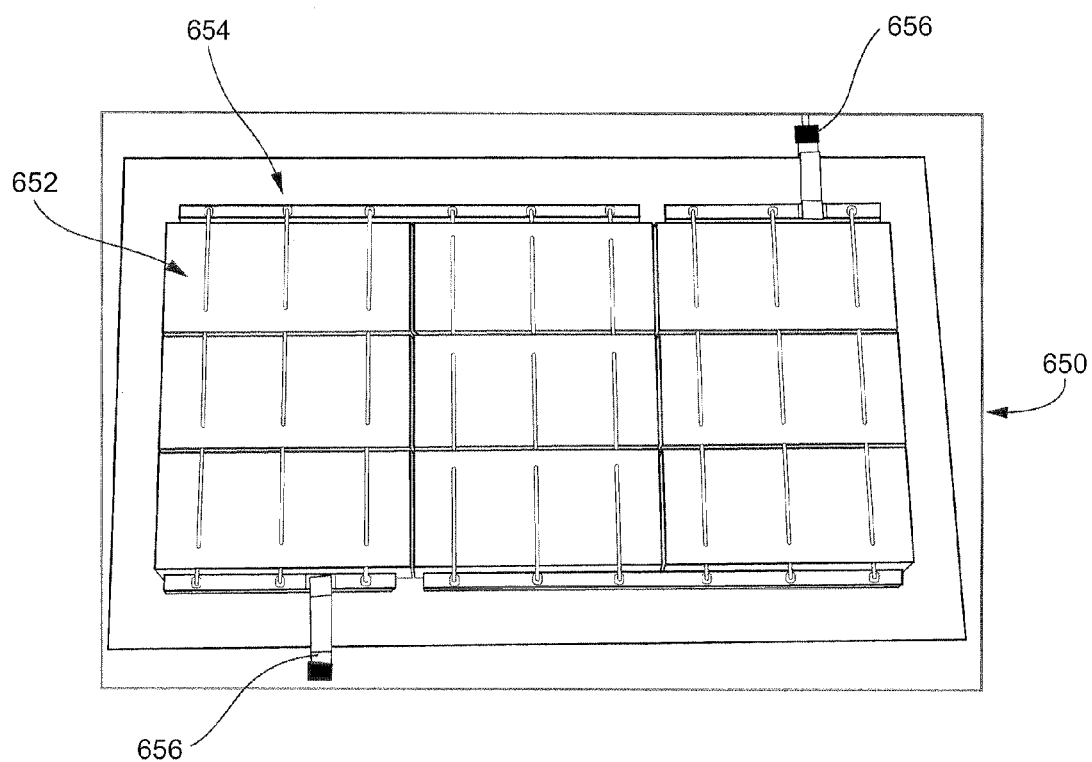
FIG. 6e is a bottom view showing an exemplary PV module according to certain example embodiments.

FIG. 6e is a bottom view showing an exemplary PV module according to certain example embodiments. PV module 650 may have a conductive adhesive 652 to make electrical connections among the solar cells. The conductive adhesive may include an adhesive such as, for example, silver epoxy that is equal parts silver adhesive and adhesive hardener. Such an epoxy may be obtained from, for example, Applied Technologies, e.g., under the designations 100A and 100B.

The conductive adhesive 652 may interface with the conductive ribbon strips 654. The conductive ribbon strips 654 may be constructed out of copper or some other conductive material (e.g., silver, etc). Conductive ribbon strips 654 may then connect to ribbon leads 656. Ribbon leads 656 may exit the PV module at one or more edges of a laminate (e.g., as shown in FIG. 3) as power connections at locations specified according to design needs.

Figure 7:
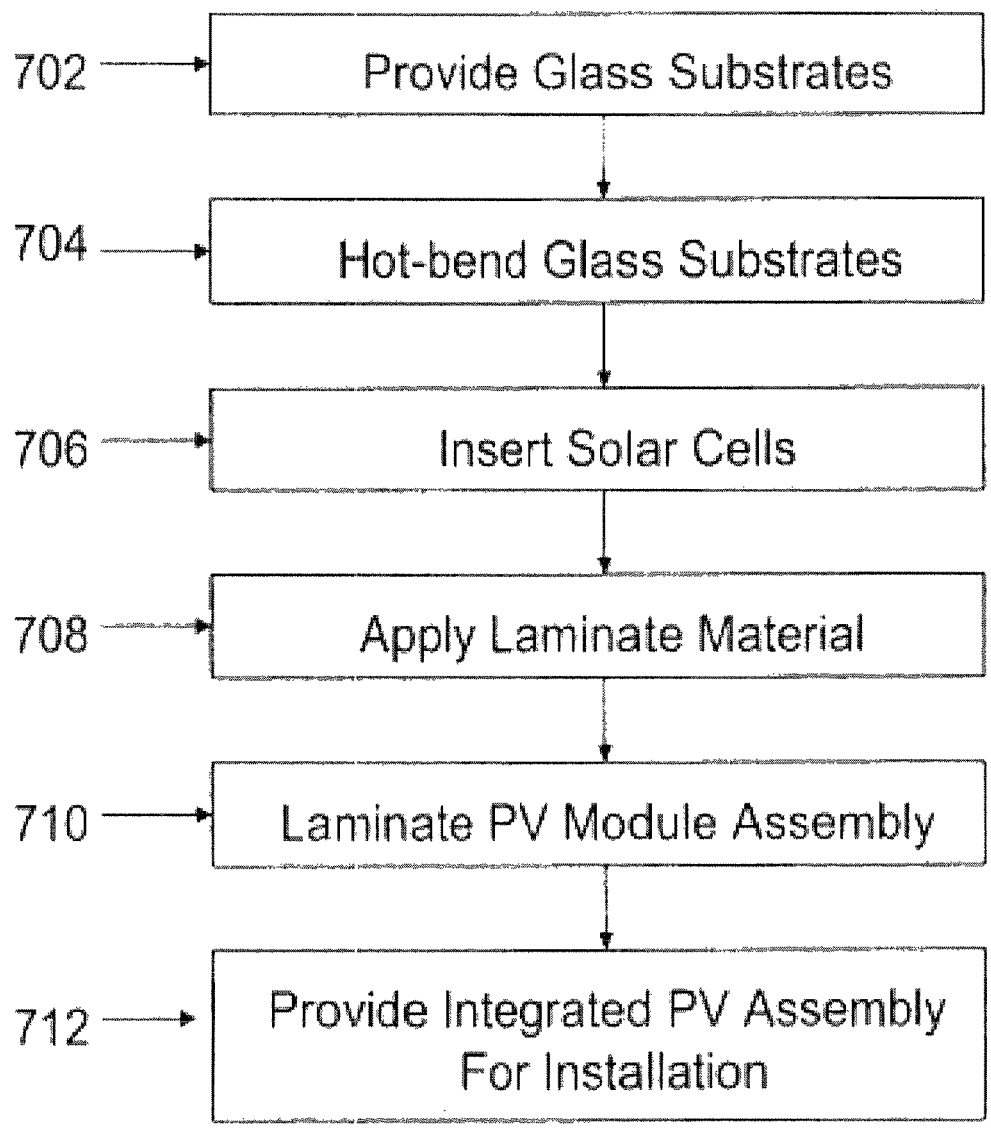
FIG. 7 is a flowchart of an illustrative process for making a PV module for use in a roof.

FIG. 7 is a flowchart of an illustrative process for making a PV module for use in a roof. In step 702 glass substrates for a PV module are provided. As discussed above, the glass substrates may be of different types and qualities (e.g., the first glass substrate may be a high transmission/low iron type of glass). The glass substrates may be processed such that the substrates both have an appropriate perimeter and edge finish for the given implementation of a PV module (e.g., design of the glass substrates may depend on their application, such as, for example, a sunroof). Further, certain painted patterns using the aforementioned ceramic enamels may also be added.

Next, in step 704, the glass substrates may then be hot formed to meet the specifications of use for PV module. Once the surface shape and/or geometry of the glass substrates meets the specifications of a given application, a PV layer consisting of PV cells may be inserted between the glass substrates in step 706.

As discussed above, thin film solar cells (e.g., CIGS or CIS, etc.) may be used in certain example embodiments. In certain example embodiments, the glass substrates may be aggressively shaped (e.g., the curvature of the glass substrates may be more than normal). In such example embodiments a thin film solar cell such as, for example, CIGS may be preferred. However, it will be appreciated that other types of solar cell technology may be implemented (e.g., crystalline silicon solar cells).

In step 708, a laminate may be applied to encapsulate the PV layer between the provided glass substrates. Polyvinyl butyral (PVB), ethyl vinyl acetate (EVA), or the like, may be used in certain example embodiments. In certain example embodiments, the PVB thickness may range from 0.1-1.0 mm, more preferably 0.38 or 0.76 mm. In certain example embodiments, the particular laminate material may be formulated so to help provide for long term durability and good adhesion over time. Other laminates with similar adhesion strength, sealing, durability, optical characteristics, and/or other qualities may also be used. For example, one-, two-, or more-part urethanes may be used in certain example embodiments. Adhesives (e.g., pressure sensitive adhesives) also may be used in certain example embodiments. Once the glass substrates, PV layer, and the laminate are combined, (e.g., oriented proximate to one another), the PV module may then subject to heat and pressure in step 710. The application of heat and/or pressure may facilitate the bonding of the two glass substrates through the laminate, sealing the PV layer therein. Further, in certain example embodiments the heat and pressure may allow the laminate (e.g., PVB) to become optically clear. Of course, certain laminate materials may be cured by means other than heat and pressure such as, for example, UV curable materials.

Once bonded together, the two glass substrates with the PV layer sandwiched therebetween may be structurally similar to a single integrated unit (e.g., similar to an ordinary sun roof to be placed into a car). Thus, in step 712, the newly created PV module may be ready to be installed as into the roof of a car. In other words, given the dimensions or design considerations of an ordinary sunroof, the combination of the two glass substrates with the sealed PV array laminated between them may provide an integrated unit that may be proportioned and shaped in a manner substantially similar to that of the ordinary sunroof. It will be appreciated that the process of creating PV modules may create cost savings in the assembly process of a car. First, vehicle manufacturers may now not need to modify the body of the vehicle to accommodate a PV equipped sunroof. Second, as certain example embodiments may provide integrated PV modules (e.g., sun roofs with integrated PV arrays) vehicle manufactures may install a prepackage PV module in a manner similar to the installation of a conventional sunroof. It will be appreciated that this may save both time and money for vehicle manufacturers. Furthermore, in certain example embodiments the dimensioned glass substrates and PV array may be no thicker than an ordinary sunroof. Accordingly, installation of a PV equipped sunroof may not reduce the overall headroom available in the vehicle. In certain example embodiments an integrated PV module may have a thickness substantially similar to that of an ordinary sunroof and may thus be retractable and allow an opening of a sunroof.

As is known in the art, a conventional sunroof may be encapsulated through an injection molding system using thermoplastics or reaction injection molding process using conventional urethanes. Such techniques may facilitate the sealing and mounting of a glass sunroof. Likewise, an integrated PV module (e.g., PV module 200) may be encapsulated using similar or identical techniques. Accordingly, the encapsulation of, for example, PV module 200 through such techniques may facilitate direct replacement of existing roof systems. In addition, encapsulation may facilitate the routing of conductors and connector for PV functions (e.g., electrical leads, etc).

It will be appreciated that the steps for in FIG. 7 may be performed in various orders and/or certain steps may not be performed at all in different embodiments of this invention. For example, a laminate material may be provided to the glass substrates and then the PV cells may be sandwiched between the laminate material and the glass substrates.

Certain PV modules for use in certain vehicles (e.g., cars) may need to meet testing standards in order to available for public use. It will be appreciated that the techniques herein may provide for meeting and/or exceed requirements for AS-3 laminates. For example, certain example embodiments may pass the following tests: 1) 30 ft. impart dart test; 2) 30 ft. small impact ball test; 3) 2 hour boil test; and 4) 2 week water fog exposure. In addition, certain other example embodiments may meet and or pass other non-required tests, for example: 1) 2 week salt fog exposure; 2) 1000 hour 85 degree/ 85% RH exposure; 3) Shear test for the PV cell in the PV module; and 4) shear test at a copper bus. Accordingly, certain example embodiments may be constructed to meet and/or exceed certain tests (e.g., safety, durability, etc).

Although certain example embodiments have been described using hot-bending, certain other example embodiments may alternatively, or in addition to, use cold-bending to shape the glass substrates.

While certain example embodiments may have been described using TFSC, other example embodiments may use other types of solar cells. For example crystalline silicon (c-Si) may be used in conjunction with the above techniques. Other example embodiment may use amorphous silicon (e.g., a-Si), microcrystalline silicon, and/or other materials.

The glass substrates may have the same or different compositions in different embodiments. For example, in certain example embodiments, it may be desirable to provide a low iron substrate as the outermost substrate but to provide a relatively less expensive type of material for the inner substrate. This may provide the requisite strength and thickness requirements while also allowing a potentially greater amount of light to come into contact with the PV layers. Providing a lower transmissivity glass on the inner substrate on a side of the PV layers opposite the sun should not affect the performance of the overall module.

It will be appreciated by those skilled in the art that the use of glass substrates with two different compositions may result in the glass substrates having different heating coefficients. For example, the first glass substrate may have a relatively low iron percentage when compared to that of the second glass substrate. As the second glass substrate may have a higher iron count, it may heat up more rapidly than the first glass substrate (e.g., as a result of the iron absorbing more heat). Accordingly, the rate of thermal expansion for the first and second glass substrates may be different. It will be appreciated, however, that when the rate of thermal expansion for two laminated materials is different, the laminate may not hold, as the two materials expand and contract at different rates. Thus, identification of a correct heating profile for the laminate for the two materials may be desired. The CTE difference may be of interest, e.g., when infrared (IR) heating is used and/or IR exposure is encountered, given the different IR absorption rates implied by the different iron contents.

One way of approaching this problem is to adjust the amount of heat directed at either or both of the two materials. For example, under "normal" conditions, if the first glass substrate is heating slower than the second glass substrate, techniques may be used that either add heat to the first glass substrate or remove it from the second glass substrate (e.g., through a heat sink). Thus, the first (e.g., low iron) substrate may be preferentially heated in certain example embodiments so as to account for the difference in heating coefficient with respect to the second substrate. A heating profile of the assembly may be developed and optimized in certain example instances, e.g., so as to help ensure that the substrates are appropriately laminated to one another. An example heating profile may take into account the different glass compositions, etc. The compositions of the laminates also may be adjusted and/or particular laminates selected, e.g., to help account for such differences.

The laminating may involve heating the first and second substrates according to a heating profile that takes into account the different compositions of the first and second substrates. Similarly, the hot bending of the first and second substrates (e.g., together or separately) also may be done according to a heating profile that takes into account the different compositions of the first and second substrates.

One disadvantage associated with incorporating solar cells into a vehicle's sunroof, for example, is that the solar cells are not transparent. Of course, full transparency may not be desirable, e.g., because excessive heat from full sunlight may overheat passengers and/or the interior of the car. There is, however, a balance between allowing some light to be transmitted into the vehicle while still harvesting the sun's energy to augment electrical generation system of the vehicle. Because most solar cells are not translucent or on translucent substrates, there is a need in the art for alternate techniques for allowing up to a predetermined amount of light to pass through a PV sunroof and into the vehicle's interior.

The inventors of the instant application have recognized the need for this balance and, accordingly, have explored the possibility of creating a plurality of through-holes in the solar cells that would let a small percent of the incident light into the vehicle compartment. Some commercial sunroofs have visible transmissions of about 10% (although other commercial implementations have higher and lower visible transmissions, e.g., in different vehicles, different vehicle models, etc.). Thus, it sometimes is desirable to match this transmission percentage while providing PV functionality.

Unfortunately, although a regular series of through-holes at least theoretically could increase transmission and could be manufactured fairly easily, the inventors have observed that this approach is complicated by the fact that the solar cell(s) are to be sandwiched between two adhesive layers that, in turn, bond to the inner and outer glass pieces that make up the glass laminate structure. More particularly, the inventors have discovered that in the laminating process, a solar cell or aggregate of solar cells with small holes in them would not allow the adhesive to flow into the holes and create a non-scattering light path through the now-filled holes. Thus, the through-holes actually initially caused more problems than they solved, since they did not fulfill their function of letting light pass through them while also creating an irregular visual appearance, e.g., as viewed from a passenger in the vehicle.

It surprisingly and unexpectedly was discovered that, given these circumstances and in certain example implementations, it was not desirable to alter lamination processes to account for PV sunroof laminations as well as other non-sunroof glass laminations (windshields, etc.). That is, it was discovered that, given these circumstances and in certain example implementations, it is undesirable to customize the adhesive type as well as the temperature, pressure, time cycle, and other related process conditions, for PV sunroof laminations as compared to other non-sunroof glass laminations (windshields, etc.).

Instead, it was discovered that there exists a uniquely optimum subset of hole dimensions, aspect ratios, and spacings that satisfy the conditions for adhesive flow into the holes such that the adhesive fills or nearly fills the openings, thereby resulting in non-scattered light passing through the openings and into the passenger compartment, together with a more uniform (aesthetically pleasing) visual appearance when viewed from the perspective of the passenger in the vehicle.

Thus, customer requirements for periodic openings in PV cells on laminated sunroofs have led to the discovery that only certain openings in the PV structure will result in lamination substantially free from entrapped bubbles (typically air, but sometimes other gasses). Certain example embodiments of this invention thus relate to perforation geometries that reduce the likelihood of air entrapment during manufacturing.

Figure 8A:
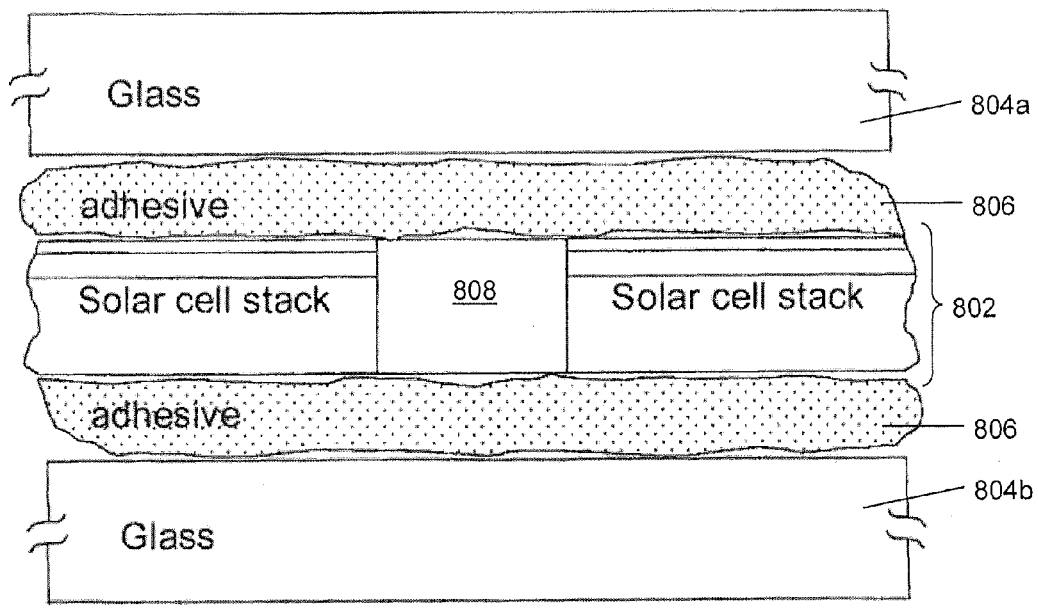
FIG. 8a is a schematic representation of a cross-section through an assembly having appropriately sized holes, prior to lamination, in accordance with an example embodiment.

FIG. 8a is a schematic representation of a cross-section through a pre-laminated assembly having appropriately sized holes, in accordance with an example embodiment. It will be appreciated that FIG. 8a and FIGS. 8b, 9a, and 9b that follow are not shown to scale. For instance, it will appreciated that the glass substrates typically are much thicker than the adhesive and the solar cell. It also will be appreciated that the holes may be much smaller than the thickness of glass, and/or may be regular or irregular in shape. In certain example embodiments, the holes may have one major dimension much larger than the other major dimension. As an example, the holes may be slots where the short dimension may be 1 mm or smaller, while the long dimension may be 1 cm or longer.

As shown in FIG. 8a, a solar cell stack 802 is sandwiched between first and second substrates 804a and 804b. Adhesive material 806 is provided on one or both sides of the solar cell stack 802. One hole 808 is formed in the solar cell stack 802, e.g., to increase visible transmission into the vehicle (e.g., as compared to a situation where no holes are provided). It will be appreciated that although one hole is shown in FIG. 8a, multiple holes may be provided in regular or irregular configurations.

Figure 8B:
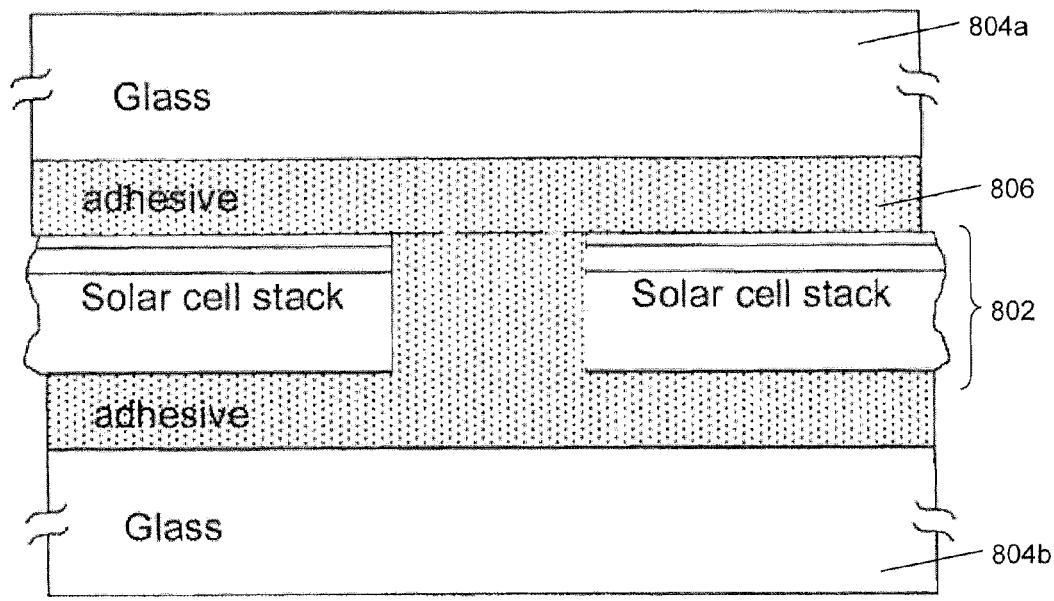
FIG. 8b is a cross-sectional viewing illustrating what happens to the FIG. 8a embodiment during the lamination cycle in certain example implementations.

FIG. 8b is a cross-sectional viewing illustrating what happens to the FIG. 8a embodiment during the lamination cycle in certain example implementations. That is, FIG. 8b illustrates that, during the lamination cycle, the adhesive will stick to the glass, conforming to its flat surface, and will stick to the solar cell, conforming to its flat surface. By judicious selection of the perforation dimensions, the adhesive will also relax and completely or substantially completely fill in the opening of the perforation. Light passing through the adhesive preferably will not see any air-adhesive interfaces, and/or any distorted surfaces (e.g., related to air bubbles caused by trapped gas or the like).

Figure 9A:
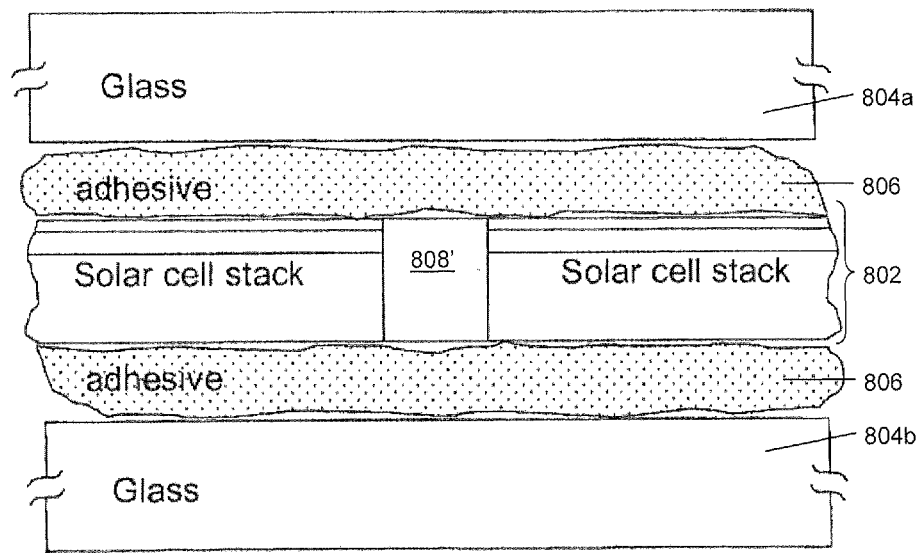
FIG. 9a is a schematic representation of a cross-section through an assembly having an inappropriately sized opening formed therein, prior to lamination.
Figure 9B:
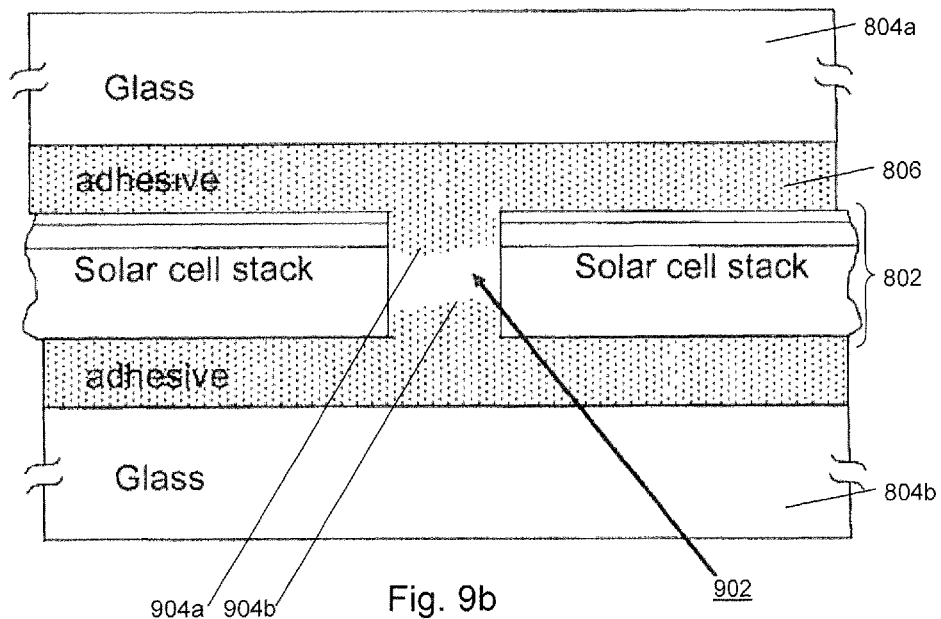
FIG. 9b illustrates example consequences, following lamination, of the inappropriately sized opening from the FIG. 9a example.

FIG. 9a is a schematic representation of a cross-section through an assembly having an inappropriately sized opening 808' formed therein, prior to lamination. FIG. 9b illustrates example consequences, following lamination, of the inappropriately sized opening from the FIG. 9a example. As will be appreciated from the FIG. 9b example, the adhesive 806 does not completely or even substantially fill in the opening 808'. It instead forms an air pocket 902 along with air-adhesive interfaces 904a and 904b. The shape of those interfaces 904a and 904b may be smooth or irregular in different scenarios and may sometimes even partially touch one another. It will be appreciated that light incident on these features may be highly scattered or bent, resulting in frustrated light transmission through the opening in the solar cell stack 802. The end result may be a displeasing aesthetic appearance and/or failure to meet the target visible transmission.

Figure 10A:
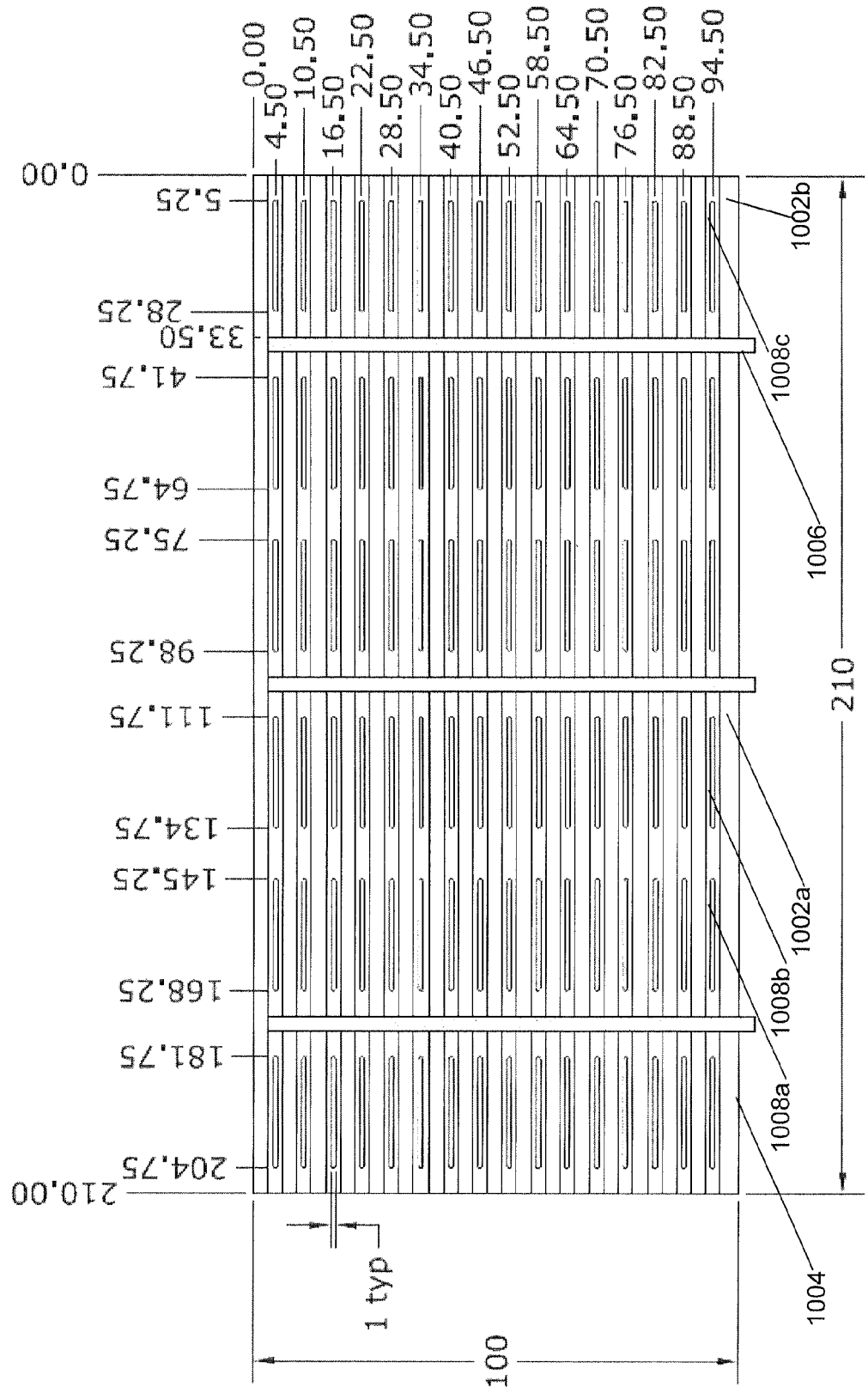
FIG. 10a is a top plan view of a schematic PV module having appropriately sized holes, in accordance with an example embodiment.

FIG. 10a is a top plan view of a schematic PV module having appropriately sized holes, in accordance with an example embodiment. The dimensions shown in FIG. 10a are provided in mm, although it will be appreciated that other dimensions may be suitable for different embodiments of this invention. The openings shown in the FIG. 10a example are regularly shaped and provided at regular intervals. However, it will be appreciated that this need not necessarily be the case in all example embodiments. For instance, differently sized openings may be formed at one or more regular or irregular intervals in different example embodiments. The vertical dimensions in FIG. 10a are provided to the center lines of the openings, where appropriate.

As shown in the FIG. 10a example, the PV module includes two different sized areas 1002a and 1002b that support solar cell device stacks. These areas 1002a and 1002b are at least partially defined by a pattern of conductive lines 1004, and bus bars 1006. It will be appreciated that the conductive lines 1004 and/or bus bars 1006 may be of or include silver or any other conductive material. In the FIG. 10a example, the bus bars 1006 may protrude downwardly from the main body portion of the PV module and may represent, for example, the positive side of the circuit in certain example embodiments. Although not shown in the FIG. 10a example, additional bus bars may protrude upwardly from the opposite side of the module and form the negative side of the circuit. These bus bars may be substantially in-line with the bus bars 1006 shown in FIG. 10a in some cases, e.g., to reduce the visual or aesthetic impact of the bus bars, allow for a greater area of coverage by the solar cell functional layers, etc. The bus bars may collectively serve as "collection lines" in certain example embodiments. However, it will be appreciated that alternative designs may collect power through other means and thus may not necessarily use bar bars of the sort shown in FIG. 10a.

In the FIG. 10a example, openings are formed in every other row of the grid. Two openings 1008a and 1008b are formed within the larger area 1002a, whereas only one opening 1008c is formed within the smaller area 1002b. Each opening 1008 is the same size and shape, however. As indicated above, the openings 1008 may be sized and shaped so as to meet a target visible transmission value. In the FIG. 10a example embodiment, the openings are slot-shaped with rounded corners. The major diameter of the slot is 23 mm, and the minor diameter is 1 mm. Thus, the openings are about 23 square mm in area. However, the placement of the openings 1008 may be further controlled in response to a minimum distance between the edge of the opening and the conductive material (e.g., collection lines, grid, etc.). It has been found, for example, that an edge-to-edge distance of about 1 mm is sufficient to prevent shorts that otherwise might render the module partially or fully inoperable. A distance of about 2 mm is more preferable, and a distance of about 3 mm is still more preferable.

In certain example embodiments, the openings may be centered between the grid lines in the height dimension. For the smaller areas 1002b, the openings 1008c may be horizontally centered between the edge of the module and the adjacent bus bar 1006. For the larger areas 1002a, opposite edges of the openings 1008a and 1008b may be equally spaced apart from their closest bus bars 1006, respectively.

Figure 10B:
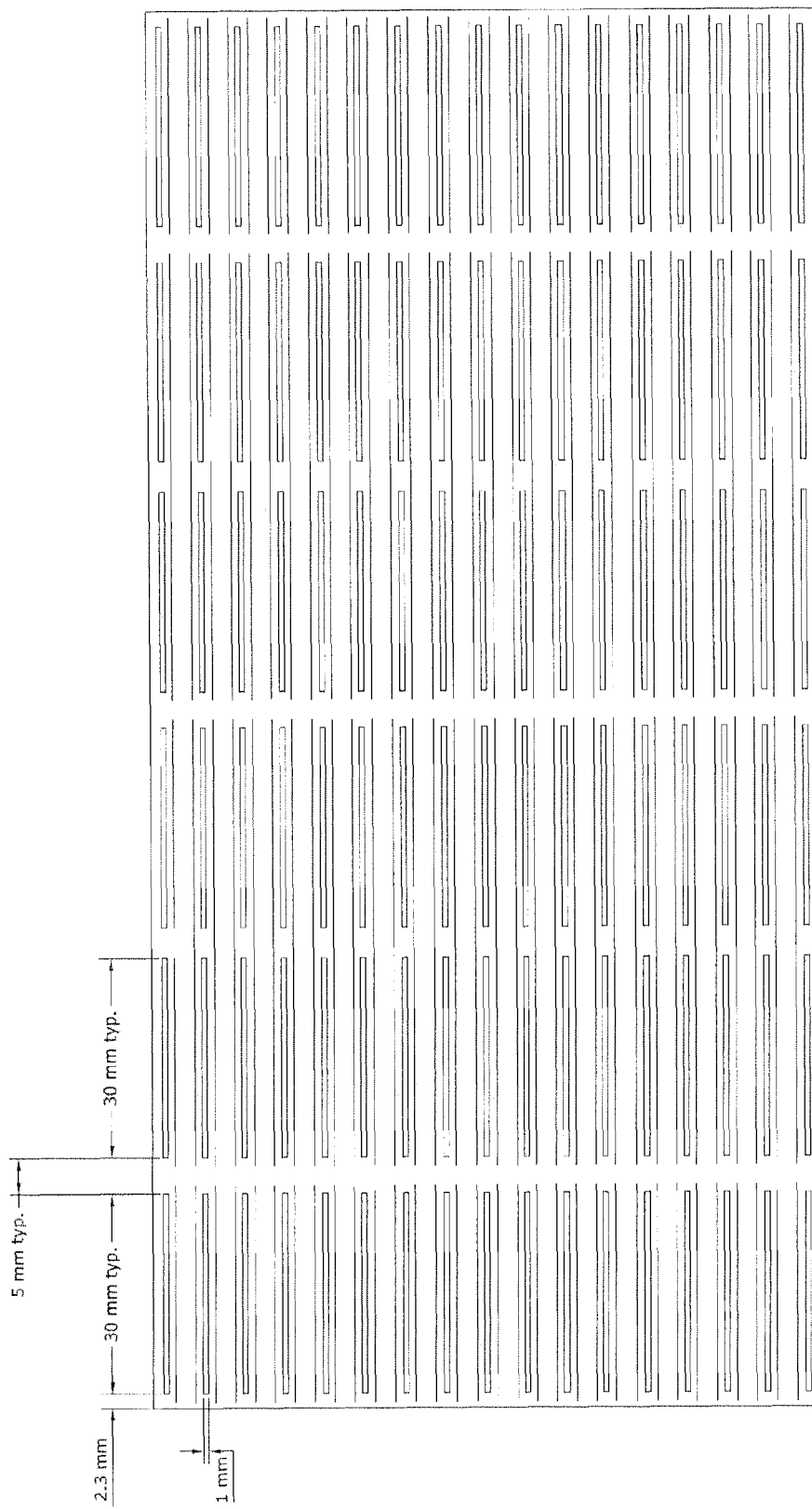
FIG. 10b is a top plan view of a more generic PV module having appropriately sized holes, in accordance with an example embodiment.

As indicated above, FIG. 10a is exemplary in many respects. FIG. 10b is a top plan view of a more generic PV module having appropriately sized holes, in accordance with an example embodiment. As can be seen, the bus bars have been removed, and typical or exemplary dimensions are provided. Of course, it will be appreciated that even these dimensions may be modified in different example embodiments. Similarly, different shapes for the openings may be provided in connection with one or more different embodiments. Referring more particularly to FIG. 10b, the openings' major distance is 30 mm, and the openings' minor distance is 1 mm. The openings at the peripheries are spaced 2.3 mm from the edge, e.g., to allow for multiple modules to be coupled to one another and/or the vehicle, etc. Adjacent openings are spaced 5 mm from one another to allow enough space for bus bars or other major electrical connections, to help reduce the likelihood of shorts, etc.

Figure 11:
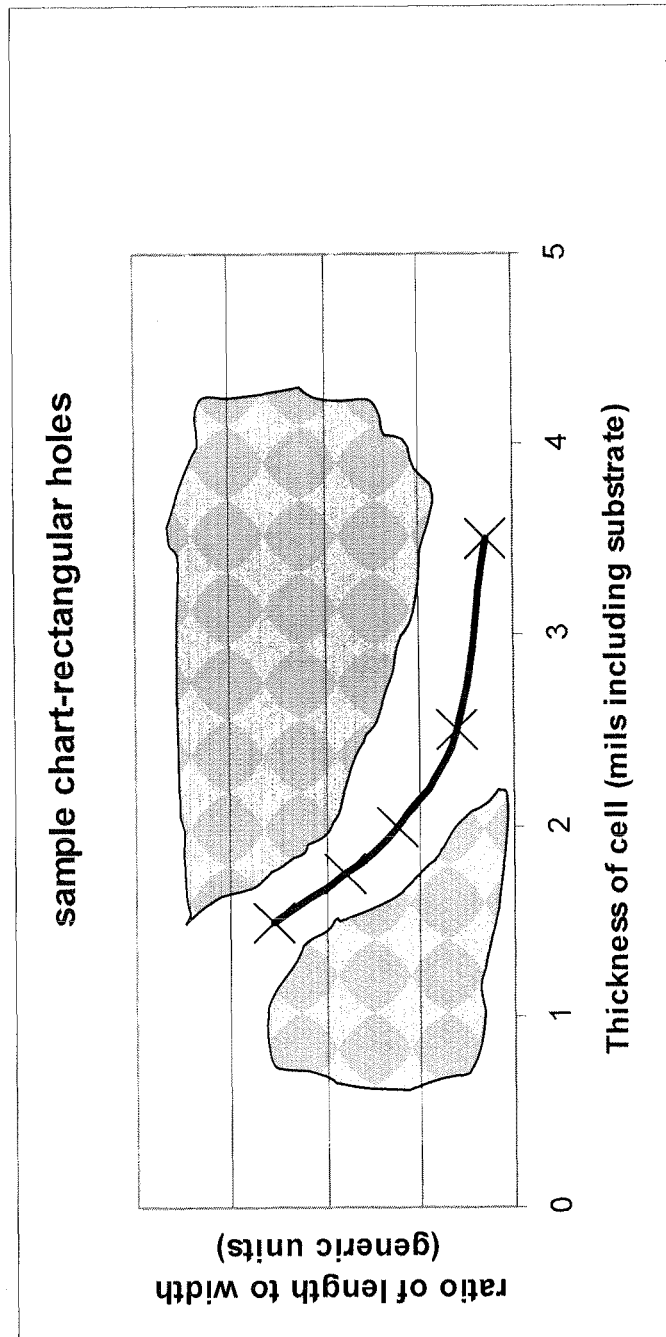
FIG. 11 is a graph demonstrating areas of aspect ratios and cell thicknesses at which the laminate is expected to succeed and fail for example rectangular holes.

FIG. 11 is a graph demonstrating areas of aspect ratios and cell thicknesses at which the laminate is expected to succeed and fail for example rectangular holes. That is, the FIG. 11 graph plots the ratio of the length to the width (in generic units) versus the cell thickness (e.g., in mils) for a sample rectangular hole. The area above the line in FIG. 11 is suggestive of length-to-width geometries that are not filled with laminate material (and thus represent failures), whereas the area below the line is suggestive of length-to-width geometries that are filled with the laminate. Different graphs such as that shown in FIG. 11 may be developed for different combinations of hole geometries (e.g., for square, rectangular, ovular, hexagonal, and/or other shaped holes), laminating materials, autoclave or heat treatment cycles and process conditions (such as, for example, temperatures, pressures, time cycles, and so forth), etc. The values for the boundary curve may be empirically determined or theoretically calculated, e.g., based on the selected materials. In different scenarios, the boundary line may be curved or substantially linear.

Figure 12:
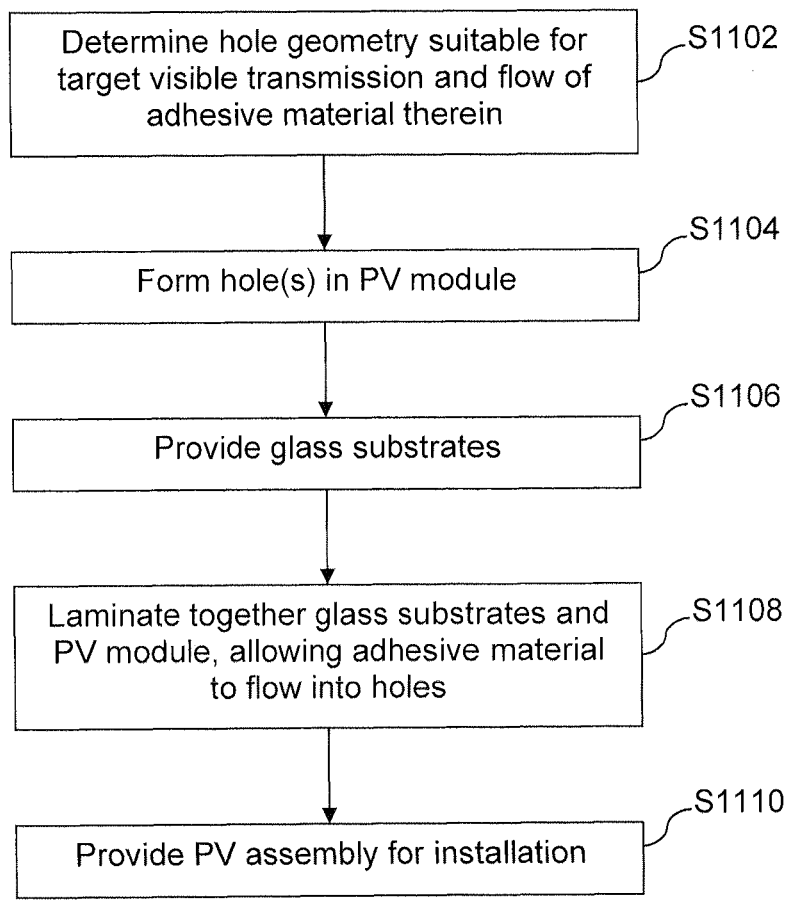
FIG. 12 is a flowchart of an illustrative process for making a PV module with appropriately sized holes for use in a vehicle, in accordance with an example embodiment.

FIG. 12 is a flowchart of an illustrative process for making a PV module with appropriately sized holes for use in a vehicle, in accordance with an example embodiment. As shown in FIG. 12, a hole geometry suitable for a target visible transmission as for allowing the flow of adhesive material therein is determined in step S1102. As indicated above, this may take into account hole dimensions, aspect ratios, and spacings that satisfy the conditions for adhesive flow into the hole(s), e.g., for a given adhesive material, PV module thickness, etc. One or more holes may be formed in the PV module in step S1104, e.g., in accordance with the selected hole geometry. The holes may be formed by any suitable technique. For instance, the holes may be formed by laser scribing (e.g., using equipment available from Hitachi Via Mechanics USA, Inc. that has been modified to meet the requirements determined for the size, positioning, arrangement, etc., or any other supplier), by cutting, punching, and/or any other suitable technique. Glass substrates are provided in step S1106. These substrates may be bent, e.g., as described above. The glass substrates and the PV module with the holes(s) formed therein are laminated together in step S1108. As a part of this process, adhesive material is allowed to flow into the hole(s). Preferably, following lamination, the holes are filled or substantially filled, such that there are no significant gaps and/or no additional interfaces in areas proximate to the hole(s). Furthermore, following lamination, the assembly is substantially free from air bubbles or the like. The PV assembly ultimately is provided for installation (e.g., as the sunroof in a vehicle) in step S1110.

In view of the foregoing, it will be appreciated that certain example embodiments relate to PV modules that include one or more openings. In some case, characteristics of the openings are selected and/or adjusted so as to allow transmitted light to impinge on the interior compartment of the vehicle, while still ensuring a good aesthetic appearance of the assemblies into which the PV modules are built. Furthermore, certain example embodiments take into account the constraints related to the nature of the adhesive and the laminating process (including process conditions such as, for example, temperature, pressure, time cycle, etc) and involve selecting configurations that help ensure that the desired amount of light successfully being transmitted through the perforations. For example, if the selection of the opening dimensions may be adjusted to accommodate the desire for the adhesive material to properly flow into the openings. Certain example embodiments thus relate to the subset of shapes and sizes of openings that result in a substantially uniform cross-section of post-lamination adhesive, e.g., for a given adhesive material and set of process conditions.

For example, given the desire for a 10% overall light transmission of incident light through openings in connection with an arrangement that includes a particular adhesive and laminating cycle and a solar cell of a particular thickness, it will be appreciated that there is a ratio of perforation length to width of a rectangular opening (rounded corners assumed) above which laminate material will not successfully penetrate. Conversely, ratios below that value may successfully penetrate into the openings. Certain example embodiments involve recognizing the existence of that boundary and, as a corollary, the area defined by that boundary that leads to successful opening filling—and then using that information to build a PV assembly, e.g., for use in a vehicle.

In certain example embodiments, one or both of the substrates may be heat treated (e.g., heat strengthened or thermally tempered). The terms "heat treatment" and "heat treating" as used herein mean heating the article to a temperature sufficient to achieve thermal tempering and/or heat strengthening of the glass inclusive article. This definition includes, for example, heating a coated article in an oven or furnace at a temperature of at least about 550 degrees C., more preferably at least about 580 degrees C., more preferably at least about 600 degrees C., more preferably at least about 620 degrees C., and most preferably at least about 650 degrees C. for a sufficient period to allow tempering and/or heat strengthening. This may be for at least about two minutes, or up to about 10 minutes, in certain example embodiments.

As used herein, the terms "on," "supported by," and the like should not be interpreted to mean that two elements are directly adjacent to one another unless explicitly stated. In other words, a first layer may be said to be "on" or "supported by" a second layer, even if there are one or more layers therebetween.

In certain example embodiments, a method of making an integrated photovoltaic (PV) module for use in a vehicle is provided. First and second glass substrates are provided. A PV module is provided, with the PV module having a plurality of through-holes formed therein. The first and second glass substrates are laminated together with the PV module therebetween. During said laminating, laminating material is allowed to at least substantially fill the plurality of through-holes in the PV module as a result of the through-holes' size, shape, and placement. The through-holes collectively have a total area selected so as to allow visible transmission through the integrated PV module to reach a selected target value.

In addition to the features of the previous paragraph, in certain example embodiments, the target value may be 10%.

In addition to the features of either of the two previous paragraphs, in certain example embodiments, the PV module may include a plurality of spaced apart solar cells.

In addition to the features of the previous paragraph, in certain example embodiments, the solar cells may be separated by a grid of conductive material.

In addition to the features of the previous paragraph, in certain example embodiments, the through-holes may be spaced from lines of the grid at a distance sufficient to prevent electrical shorts.

In addition to the features of the previous paragraph, in certain example embodiments, the distance may be at least about 1 mm.

In addition to the features of any of the four previous paragraphs, in certain example embodiments, the through-holes may be substantially centered within cells of the grid.

In addition to the features of any of the five previous paragraphs, in certain example embodiments, at least some of through-holes may be located between adjacent solar cells.

In addition to the features of any of the six previous paragraphs, in certain example embodiments, at least some of the through-holes may be located at a peripheral edge of the PV module, and/or may be closer to the peripheral edge than any solar cells.

In addition to the features of any of the eight previous paragraphs, in certain example embodiments, a plurality of bus bars (e.g., 3 positive and 3 negative, or other suitable arrangement) may be connected to the PV module.

In addition to the features of any of the ten previous paragraphs, in certain example embodiments, the through-holes each may be generally elongate and may have rounded corners.

Certain example embodiments relate to a method of making a vehicle, the method comprising: providing an integrated photovoltaic (PV) module made by the method of any of the previous 11 paragraphs, for example; and building the integrated PV module into the vehicle.

In certain example embodiments, a method of making a photovoltaic (PV) module is provided. A substrate with a plurality of solar cells formed thereon is provided. A grid of conductive material is provided on the substrate. A plurality of through-holes are formed in the substrate in a pattern such that (a) the through-holes collectively have a total area selected so as to allow visible transmission through an integrated PV module in which the PV module is disposed to reach a selected target value, and (b) the through-holes have an aspect ratio and a positioning sufficient to allow laminating material used in making the integrated PV module to flow therein and substantially fill the through-holes.

In addition to the features of the previous paragraph, in certain example embodiments, the through-holes may be formed by laser cutting.

In addition to the features of either of the two previous paragraphs, in certain example embodiments, the solar cells may be CIGS-type solar cells.

In certain example embodiments, an integrated photovoltaic (PV) module for use in a vehicle is provided. First and second glass substrates are provided. A PV module includes a plurality of spaced apart solar cells and has a plurality of through-holes formed therein. The PV module is interposed between the first and second glass substrates. A plurality of collection lines are formed on the substrate and between adjacent solar cells. The PV module is laminated to the first and second substrates such that the plurality of through-holes in the PV module are substantially filled with laminating material as a result of the through-holes' size, shape, and placement. The through-holes collectively have a total area selected so as to allow visible transmission through the integrated PV module to reach a selected target value.

In addition to the features of the previous paragraph, in certain example embodiments, the through-holes may be spaced from lines of the grid at a distance sufficient to prevent electrical shorts.

In addition to the features of either of the two previous paragraphs, in certain example embodiments, the through-holes may be substantially centered within cells of the grid.

In addition to the features of any of the three previous paragraphs, in certain example embodiments, a first subset of the through-holes may be located between adjacent solar cells; and/or a second subset of the through-holes may be located at a peripheral edge of the PV module, and optionally may be closer to the peripheral edge than any solar cells.

In addition to the features of any of the four previous paragraphs, in certain example embodiments, the laminating material may be PVB.

In addition to the features of any of the five previous paragraphs, in certain example embodiments, the solar cells may be CIGS-type solar cells.

In addition to the features of any of the six previous paragraphs, in certain example embodiments, the second glass substrate may have more iron than the first glass substrate.

Certain example embodiments relate to a sunroof comprising the integrated photovoltaic (PV) module of any of the previous seven paragraphs, for example.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making an integrated photovoltaic (PV) module for use in a vehicle, the method comprising:
    providing first and second glass substrates;
    providing a PV module, the PV module having a plurality of through-holes formed therein;
    laminating together the first and second glass substrates with the PV module therebetween; and
    wherein during said laminating, laminating material is allowed to at least substantially fill the plurality of through-holes in the PV module as a result of the through-holes' size, shape, and placement, and
    wherein the through-holes collectively have a total area selected so as to allow visible transmission through the integrated PV module to reach a selected target value.

2. The method of claim 1, wherein the target value is 10%.

3. The method of claim 1, wherein the PV module includes a plurality of spaced apart solar cells.

4. The method of claim 3, wherein the solar cells are separated by a grid of conductive material.

5. The method of claim 4, wherein the through-holes are spaced from lines of the grid at a distance sufficient to prevent electrical shorts.

6. The method of claim 5, wherein the distance is at least about 1 mm.

7. The method of claim 4, wherein the through-holes are substantially centered within cells of the grid.

8. The method of claim 4, wherein at least some of through-holes are located between adjacent solar cells.

9. The method of claim 4, wherein at least some of the through-holes are located at a peripheral edge of the PV module, and are closer to the peripheral edge than any solar cells.

10. The method of claim 3, further comprising connecting a plurality of bus bars to the PV module.

11. The method of claim 1, wherein the through-holes each are generally elongate and have rounded corners.

12. A method of making a vehicle, the method comprising:
    providing an integrated photovoltaic (PV) module made by the method of claim 1; and
    building the integrated PV module into the vehicle.

13. A method of making a photovoltaic (PV) module, the method comprising:
    providing a substrate with a plurality of solar cells formed thereon;
    providing a grid of conductive material on the substrate;
    forming a plurality of through-holes in the substrate in a pattern such that (a) the through-holes collectively have a total area selected so as to allow visible transmission through an integrated PV module in which the PV module is disposed to reach a selected target value, and (b) the through-holes have an aspect ratio and a positioning sufficient to allow laminating material used in making the integrated PV module to flow therein and substantially fill the through-holes.

14. The method of claim 13, wherein the through-holes are formed by laser cutting.

15. The method of claim 13, wherein the solar cells are CIGS-type solar cells.

16. An integrated photovoltaic (PV) module for use in a vehicle, comprising:
    first and second glass substrates;
    a PV module including a plurality of spaced apart solar cells and having a plurality of through-holes formed therein, the PV module being interposed between the first and second glass substrates; and
    a plurality of collection lines formed on the substrate and between adjacent solar cells,
    wherein the PV module is laminated to the first and second substrates such that the plurality of through-holes in the PV module are substantially filled with laminating material as a result of the through-holes' size, shape, and placement, and
    wherein the through-holes collectively have a total area selected so as to allow visible transmission through the integrated PV module to reach a selected target value.

17. The module of claim 16, wherein the through-holes are spaced from lines of the grid at a distance sufficient to prevent electrical shorts.

18. The module of claim 16, wherein the through-holes are substantially centered within cells of the grid.

19. The module of claim 16, wherein:
    a first subset of the through-holes are located between adjacent solar cells, and
    a second subset of the through-holes are located at a peripheral edge of the PV module, and are closer to the peripheral edge than any solar cells.

20. The module of claim 16, wherein the laminating material is PVB.

21. The module of claim 16, wherein the solar cells are CIGS-type solar cells.

22. The module of claim 16, wherein the second glass substrate has more iron than the first glass substrate.

23. A sunroof comprising the integrated photovoltaic (PV) module of claim 16.

* * * * *